United States Patent
Mikawa et al.

(10) Patent No.: US 10,903,072 B2
(45) Date of Patent: Jan. 26, 2021

(54) CONDUCTIVE C-PLANE GAN SUBSTRATE

(71) Applicant: MITSUBISHI CHEMICAL CORPORATION, Tokyo (JP)

(72) Inventors: Yutaka Mikawa, Tokyo (JP); Hideo Fujisawa, Tokyo (JP); Tae Mochizuki, Tokyo (JP); Hideo Namita, Tokyo (JP); Shinichiro Kawabata, Kawasaki (JP)

(73) Assignee: MITSUBISHI CHEMICAL CORPORATION, Tokyo (JP)

(*) Notice: Subject to any disclaimer, the term of this patent is extended or adjusted under 35 U.S.C. 154(b) by 0 days.

(21) Appl. No.: 16/930,121

(22) Filed: Jul. 15, 2020

(65) Prior Publication Data

US 2020/0350163 A1 Nov. 5, 2020

Related U.S. Application Data

(63) Continuation of application No. 16/270,124, filed on Feb. 7, 2019, which is a continuation of application No. PCT/JP2017/028482, filed on Aug. 4, 2017.

(30) Foreign Application Priority Data

Aug. 8, 2016 (JP) ................................ 2016-155958

(51) Int. Cl.
*H01L 21/02* (2006.01)
*C30B 29/38* (2006.01)
(Continued)

(52) U.S. Cl.
CPC .......... *H01L 21/02389* (2013.01); *C30B 7/10* (2013.01); *C30B 29/38* (2013.01);
(Continued)

(58) Field of Classification Search
CPC ........................................... C30B 29/403–406
See application file for complete search history.

(56) References Cited

U.S. PATENT DOCUMENTS

2006/0099781 A1 5/2006 Beaumont et al.
2009/0127664 A1* 5/2009 Okahisa .............. H01L 21/0237
257/615
(Continued)

FOREIGN PATENT DOCUMENTS

JP 11-43398 A 2/1999
JP 2001-288000 A 10/2001
(Continued)

OTHER PUBLICATIONS

Key et. al. (2019). Structural and Electrical Characterization of 2" Ammonothermal Free-Standing GaN Wafers. Progress toward Pilot Production. Materials. 12. 1925. 10.3390/ma12121925 (Year: 219).*

(Continued)

*Primary Examiner* — Alia Sabur
(74) *Attorney, Agent, or Firm* — Element IP, PLC

(57) ABSTRACT

A conductive C-plane GaN substrate has a resistivity of $2\times10^{-2}$ Ω·cm or less or an n-type carrier concentration of $1\times10^{18}$ cm$^{-3}$ or more at room temperature. At least one virtual line segment with a length of 40 mm can be drawn at least on one main surface of the substrate. The line segment satisfies at least one of the following conditions (A1) and (B1): (A1) when an XRC of (004) reflection is measured at 1 mm intervals on the line segment, a maximum value of XRC-FWHMs across all measurement points is less than 30 arcsec; and (B1) when an XRC of the (004) reflection is measured at 1 mm intervals on the line segment, a difference between maximum and minimum values of XRC peak angles across all the measurement points is less than 0.2°.

18 Claims, 17 Drawing Sheets

(51) Int. Cl.
*C30B 29/40* (2006.01)
*H01L 29/20* (2006.01)
*C30B 7/10* (2006.01)
*C30B 33/06* (2006.01)
*H01L 33/00* (2010.01)

(52) U.S. Cl.
CPC ............ *C30B 29/406* (2013.01); *C30B 33/06* (2013.01); *H01L 21/0254* (2013.01); *H01L 21/0262* (2013.01); *H01L 21/02609* (2013.01); *H01L 21/02639* (2013.01); *H01L 21/02647* (2013.01); *H01L 29/2003* (2013.01); *H01L 33/0093* (2020.05); *H01L 21/02433* (2013.01)

(56) References Cited

U.S. PATENT DOCUMENTS

| 2012/0251431 | A1 | 10/2012 | Fujisawa |
| 2014/0147650 | A1 | 5/2014 | Jiang et al. |
| 2014/0167086 | A1 | 6/2014 | Jang et al. |
| 2015/0361587 | A1 | 12/2015 | Mikawa et al. |
| 2016/0215410 | A1 | 7/2016 | Hashimoto |
| 2017/0327971 | A1 | 11/2017 | Fujisawa et al. |

FOREIGN PATENT DOCUMENTS

| JP | 2002-231647 A | | 8/2002 |
| JP | 2004-193371 A | | 7/2004 |
| JP | 2005-534182 A | | 11/2005 |
| JP | 2007161534 A | * | 6/2007 |
| JP | 2009-519202 A | | 5/2009 |
| JP | 2014-111527 A | | 6/2014 |
| JP | 2014-118346 A | | 6/2014 |
| JP | 2014-208571 A | | 11/2014 |
| WO | WO-2008/048303 A2 | | 4/2008 |
| WO | WO-2012/128263 A1 | | 9/2012 |
| WO | WO-2016/125890 A1 | | 8/2016 |

OTHER PUBLICATIONS

Chinese Office Action dated Jul. 27, 2020 in corresponding Chinese Application No. 201780048923.6.
R. Dwilinski, et al. "Excellent crystallinity of truly bulk ammonothermal GaN.", *Journal of Crystal Growth*, vol. 310 (2008), pp. 3911-3916.
R. Dwilinski, et al. "Recent achievements in AMMONO-bulk method.", *Journal of Crystal Growth*, vol. 312 (2010), pp. 2499-2502.
Quanxi Bao, et al. "Ammonothermal crystal growth of GaN using an NH4F mineralizer.", *Crystal Growth & Design*, vol. 13 (2013), pp. 4158-4161.
International Search Report dated Nov. 7, 2017 for the corresponding International Patent Application PCT/JP2017/028482.
International Preliminary Report on Patentability dated Feb. 21, 2019 for the corresponding International Application No. PCT/JP2017/028482.
Mikawa et al. "Ammonothermal growth of polar and non-polar bulk GaN crystal," *Proc. SPIE* 9363, Gallium Nitride Materials and Devices X, 936302, Mar. 13, 2015; https://doi.org/10.1117/12.2078137 (Year: 2015).
Kim et al., "Characterization of a 4-inch GaN wafer by X-ray diffraction topography", *CrystEngComm*, 2018, 20. 10.1039/C8CE01440J (Year: 2018).

* cited by examiner

CONDUCTIVE C-PLANE GAN SUBSTRATE

CROSS-REFERENCE TO RELATED APPLICATION

This application is a continuation of U.S. patent application Ser. No. 16/270,124, filed Feb. 7, 2019, which is a continuation of International Application PCT/JP2017/028482, filed on Aug. 4, 2017, which designated the U.S. and claims priority from Japanese Patent Application 2016-155958 filed on Aug. 8, 2016, the contents of each are hereby incorporated herein by reference in their respective entireties.

TECHNICAL FIELD

The present invention mainly relates to a conductive C-plane GaN substrate.

BACKGROUND ART

GaN (gallium nitride) is one of Group III-V compound semiconductors and has a wurtzite crystal structure belonging to the hexagonal crystal system.

In recent years, GaN single crystal substrates have attracted attention as semiconductor substrates for nitride semiconductor devices.

Nitride semiconductors are also referred to as, for example, nitride-based group III-V compound semiconductors, group III nitride compound semiconductors, and GaN-based semiconductors, and include, in addition to GaN, a compound in which gallium in GaN is partially or fully substituted with another group 13 element (such as B, Al, and In) in the periodic table.

One of highly useful GaN single crystal substrates is a C-plane GaN substrate. The C-plane GaN substrate is a GaN single crystal substrate having a main surface parallel to or slightly tilted from the C-plane.

The C-plane GaN substrate has a gallium polar surface being a main surface on the [0001] side and a nitrogen polar surface being a main surface on the [000-1] side. So far, it is mainly the gallium polar surface that is used to form nitride semiconductor devices.

Cases where a C-plane GaN substrate was made from a GaN single crystal grown by an ammonothermal method have been reported (Non-Patent Document 1, Non-Patent Document 2).

In Patent Document 1, a GaN crystal was grown by an ammonothermal method on a C-plane GaN substrate provided with a pattern mask of a stripe type. $NH_4F$ (ammonium fluoride) was used singly as a mineralizer, and according to the description, a GaN crystal film having a flat top surface and a thickness of from 160 to 580 µm was grown through the pattern mask. It is unclear on which of the gallium polar surface and the nitrogen polar surface the pattern mask was formed.

In Patent Document 2, a GaN single crystal was grown by an ammonothermal method on a C-plane GaN substrate having a nitrogen polar surface on which a pattern mask of a stripe type was provided. $NH_4F$ and $NH_4I$ (ammonium iodide) were used in combination as mineralizers, and according to the description, after passing through the pattern mask, the GaN crystal further grew in the [000-1] direction without coalescence until the GaN crystal had a size of the order of millimeters in the c-axis direction.

Non-Patent Document 3 reported growth rates of GaN crystals obtained when various ammonium halide mineralizers were used in an ammonothermal method.

PRIOR ART DOCUMENT

Patent Documents

Patent Document 1: JP-A-2014-111527
Patent Document 2: JP-A-2014-208571

Non-Patent Documents

Non-Patent Document 1: R. Dwilinski, R. Doradzinski, J. Garczynski, L. P. Sierzputowski, A. Puchalski, Y. Kanbara, K. Yagi, H. Minakuchi, H. Hayashi, "Excellent crystallinity of truly bulk ammonothermal GaN", Journal of Crystal Growth 310 (2008) 3911-3916.
Non-Patent Document 2: R. Dwilinski, R. Doradzinski, J. Garczynski, L. Sierzputowski, R. Kucharski, M. Zajac, M. Rudzinski, R. Kudrawiec, J. Serafnczuk, W. Strupinski, "Recent achievements in AMMONO-bulk method", Journal of Crystal Growth 312 (2010) 2499-2502.
Non-Patent Document 3: Quanxi Bao, Makoto Saito, Kouji Hazu, Kentaro Furusawa, Yuji Kagamitani, Rinzo Kayano, Daisuke Tomida, Kun Qiao, Tohru Ishiguro, Chiaki Yokoyama, Shigefusa F. Chichibu, "Ammonothermal Crystal Growth of GaN Using an $NH_4F$ Mineralizer", Crystal Growth & Design 4158-4161 (2013) 13.

SUMMARY OF INVENTION

Problem to be Solved by Invention

A main object of the present invention is to provide a novel conductive C-plane GaN substrate which may be preferably used, for example, for producing nitride semiconductor devices.

Solution to Problem

Embodiments of the present invention include the following.

[1] A conductive C-plane GaN substrate having a resistivity of $2 \times 10^{-2}$ Ω·cm or less or an n-type carrier concentration of $1 \times 10^{18}$ cm$^{-3}$ or more at room temperature, wherein at least one first line segment which is a virtual line segment with a length of 40 mm can be drawn at least on one main surface of the substrate, the first line segment satisfying at least one of the following conditions (A1) and (B1):

(A1) when an XRC of (004) reflection is measured at 1 mm intervals on the first line segment with a plane of incidence of X-rays parallel to the first line segment in each ω scan, a maximum value of XRC-FWHMs across all measurement points is less than 30 arcsec; and (B1) when an XRC of the (004) reflection is measured at 1 mm intervals on the first line segment with a plane of incidence of X-rays parallel to the first line segment in each ω scan, a difference between maximum and minimum values of XRC peak angles across all the measurement points is less than 0.2°.

[2] The conductive C-plane GaN substrate described in [1] above, wherein the first line segment satisfies the condition (A1).

[3] The conductive C-plane GaN substrate described in [2] above, wherein the first line segment satisfies, in addition to the condition (A1), the following condition (A2):

(A2) an average value of the XRC-FWHMs across all the measurement points on the first line segment obtained by the XRC measurement as specified in the condition (A1) is less than 20 arcsec.

[4] The conductive C-plane GaN substrate described in [2] above, wherein the first line segment satisfies, in addition to the condition (A1), the following condition (A3):
(A3) an average value and a standard deviation of the XRC-FWHMs across all the measurement points on the first line segment obtained by the XRC measurement as specified in the condition (A1) are less than 12 arcsec and less than 5 arcsec, respectively.

[5] The conductive C-plane GaN substrate described in any one of [1] to [4] above, wherein at least one second line segment which is a virtual line segment with a length of 40 mm can be drawn on the main surface on which the first line segment can be drawn, the second line segment satisfying at least one of the following conditions (C1) and (D1):
(C1) the second line segment is orthogonal to at least one of the first line segment, and when an XRC of the (004) reflection is measured at 1 mm intervals on the second line segment with a plane of incidence of X-rays parallel to the second line segment in each ω scan, a maximum value of XRC-FWHMs across all measurement points is less than 30 arcsec; and
(D1) the second line segment is orthogonal to at least one of the first line segment, and when an XRC of the (004) reflection is measured at 1 mm intervals on the second line segment with a plane of incidence of X-rays parallel to the second line segment in each ω scan, a difference between maximum and minimum values of XRC peak angles across all the measurement points is less than 0.2°.

[6] The conductive C-plane GaN substrate described in [5] above, wherein the second line segment satisfies the condition (C1).

[7] The conductive C-plane GaN substrate described in [6] above, wherein the second line segment satisfies, in addition to the condition (C1), the following condition (C2):
(C2) an average value of the XRC-FWHMs across all the measurement points on the second line segment obtained by the XRC measurement as specified in the condition (C1) is less than 20 arcsec.

[8] The conductive C-plane GaN substrate described in [6] above, wherein the second line segment satisfies, in addition to the condition (C1), the following condition (C3):
(C3) an average value and a standard deviation of the XRC-FWHMs across all the measurement points on the second line segment obtained by the XRC measurement as specified in the condition (C1) are less than 12 arcsec and less than 5 arcsec, respectively.

[9] The conductive C-plane GaN substrate described in any one of [1] to [8] above, wherein the substrate has a plurality of dislocation arrays periodically arranged on the main surface on which the first line segment can be drawn.

[10] The conductive C-plane GaN substrate described in [9] above, wherein the arrangement of the plurality of dislocation arrays on the main surface is two-dimensional.

[11] The conductive C-plane GaN substrate described in [10] above, wherein the arrangement of the plurality of dislocation arrays on the main surface has periodicity in two or more directions.

[12] The conductive C-plane GaN substrate described in any one of [1] to [11] above, wherein the substrate has a resistivity of $2 \times 10^{-2}$ Ω·cm or less at room temperature.

[13] The conductive C-plane GaN substrate described in any one of [1] to [12] above, wherein the substrate has an n-type carrier concentration of $1 \times 10^{18}$ cm$^{-3}$ or more at room temperature.

[14] The conductive C-plane GaN substrate described in any one of [1] to [13] above, wherein the substrate has an O concentration higher than the n-type carrier concentration at room temperature.

[15] The conductive C-plane GaN substrate described in [14] above, wherein the n-type carrier concentration at room temperature is from 20 to 70% of the O concentration.

[16] The conductive C-plane GaN substrate described in any one of [1] to [15] above, wherein concentrations of Li, Na, K, Mg, and Ca are all less than $1 \times 10^{16}$ atoms/cm$^3$.

[17] The conductive C-plane GaN substrate described in [16] above, wherein the substrate contains F.

[18] The conductive C-plane GaN substrate described in [17] above, wherein the substrate contains, in addition to F, one or more halogens selected from Cl, Br, and I.

[19] The conductive C-plane GaN substrate described in [18] above, wherein the substrate contains F and I.

[20] The conductive C-plane GaN substrate described in any one of [1] to [19] above, wherein the substrate has an H concentration of not less than $5 \times 10^{17}$ atoms/cm$^3$ and not more than $1 \times 10^{20}$ atoms/cm$^3$.

[21] The conductive C-plane GaN substrate described in any one of [1] to [20] above, wherein the substrate comprises a GaN crystal having an infrared absorption peak attributable to a gallium vacancy-hydrogen complex within a range of 3140 to 3200 cm$^{-1}$.

[22] The conductive C-plane GaN substrate described in any one of [1] to [21] above, wherein the substrate has a size of 45 mm or more in all of a [1-100] direction, a [10-10] direction, and a [01-10] direction.

[23] The conductive C-plane GaN substrate described in any one of [1] to [22] above, wherein the substrate is disk-shaped and has a diameter of 45 mm or more.

[24] The conductive C-plane GaN substrate described in any one of [1] to [23] above, wherein the substrate has a gallium polar surface having an orientation of within 5° from [0001].

[25] A method for producing a nitride semiconductor device, comprising the steps of: preparing the conductive C-plane GaN substrate described in any one of [1] to [24] above; and epitaxially growing one or more nitride semiconductors on the prepared conductive C-plane GaN substrate.

[26] A method for producing an epitaxial substrate, comprising the steps of: preparing the conductive C-plane GaN substrate described in any one of [1] to [24] above; and epitaxially growing one or more nitride semiconductors on the prepared conductive C-plane GaN substrate.

[27] A method for producing a bulk nitride semiconductor crystal, comprising the steps of: preparing the conductive C-plane GaN substrate described in any one of [1] to [24] above; and epitaxially growing one or more nitride semiconductor crystals on the prepared conductive C-plane GaN substrate.

[28] A method for producing a GaN layer-bonded substrate, comprising the steps of: preparing the conductive C-plane GaN substrate described in any one of [1] to [24] above; and bonding the prepared conductive C-plane GaN substrate to a heterogeneous substrate.

Effect of the Invention

According to one embodiment of the present invention, a novel conductive C-plane GaN substrate which may be preferably used, for example, for producing nitride semiconductor devices is provided.

DESCRIPTION OF EMBODIMENTS

In a GaN crystal, a crystal axis parallel to [0001] and [000-1] is referred to as a c-axis, a crystal axis parallel to <10-10> is referred to as an m-axis, and a crystal axis parallel to <11-20> is referred to as an a-axis. A crystal plane orthogonal to the c-axis is referred to as a C-plane, a crystal plane orthogonal to the m-axis is referred to as an M-plane, and a crystal plane orthogonal to the a-axis is referred to as an A-plane.

In the present specification, unless otherwise noted, references made to a crystal axis, a crystal plane, a crystal orientation, and the like means a crystal axis, a crystal plane, a crystal orientation, and the like of a GaN crystal.

Embodiments of the present invention will be described below with reference to drawings as appropriate.

1. CONDUCTIVE C-PLANE GAN SUBSTRATE

One embodiment of the present invention relates to a conductive C-plane GaN substrate.

1.1. Shape and Size

A conductive C-plane GaN substrate of the embodiment has a shape of a plate with a main surface on one side and another main surface on the opposite side, and the substrate has a thickness direction parallel or substantially parallel to the c-axis. One of the two main surfaces is a gallium polar surface, and the other is a nitrogen polar surface. The shape of the main surfaces is not particularly limited.

Figure 1A:
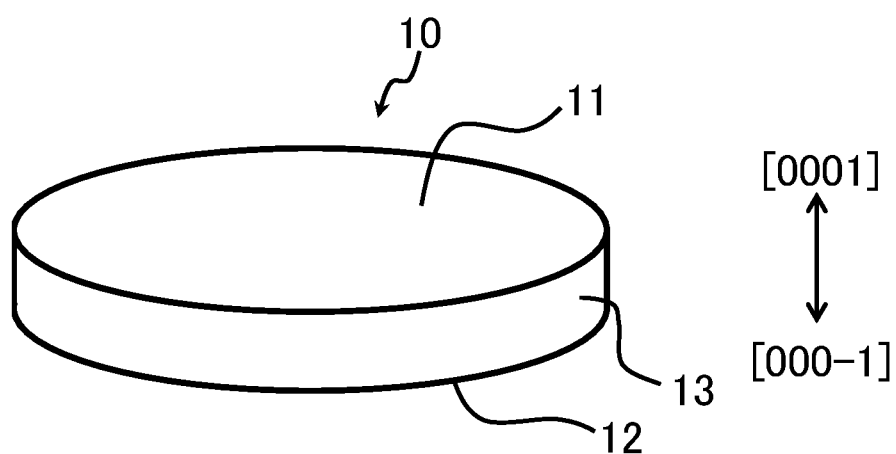
FIGS. 1A and 1B illustrate an example of the shape of a conductive C-plane GaN substrate according to an embodiment, with FIG. 1A being a perspective view and FIG. 1B being a side view.
Figure 1B:
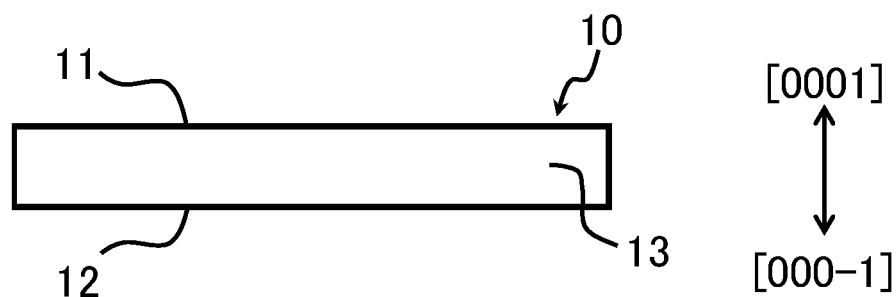

FIGS. 1A and 1B illustrates an example of the shape of the conductive C-plane GaN substrate according to the embodiment, with FIG. 1A being a perspective view and FIG. 1B being a side view.

Referring to FIGS. 1A and 1B, a conductive C-plane GaN substrate 10 is disk-shaped, and the shapes of a gallium polar surface 11 as a main surface on the [0001] side and a nitrogen polar surface 12 as a main surface on the [000-1] side are circular. The gallium polar surface 11 and the nitrogen polar surface 12 are connected to each other via a side surface 13.

Figure 2A:
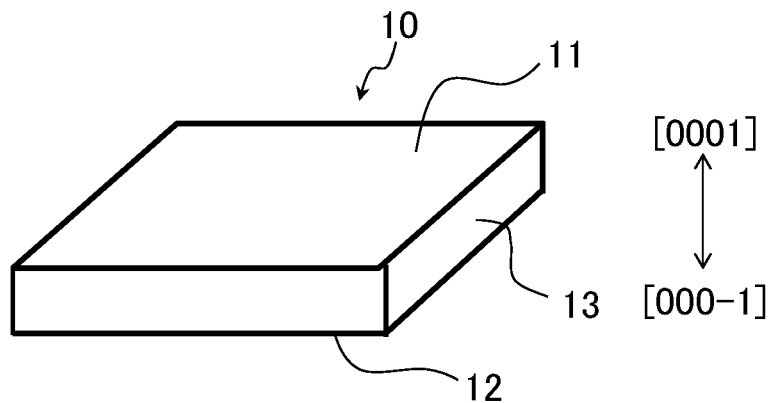
FIGS. 2A to 2C are perspective views each illustrating a shape which a conductive C-plane GaN substrate according to an embodiment may have.
Figure 2B:
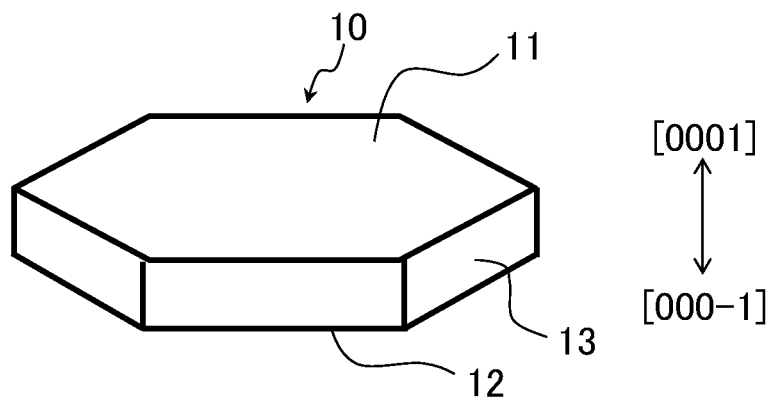
Figure 2C:
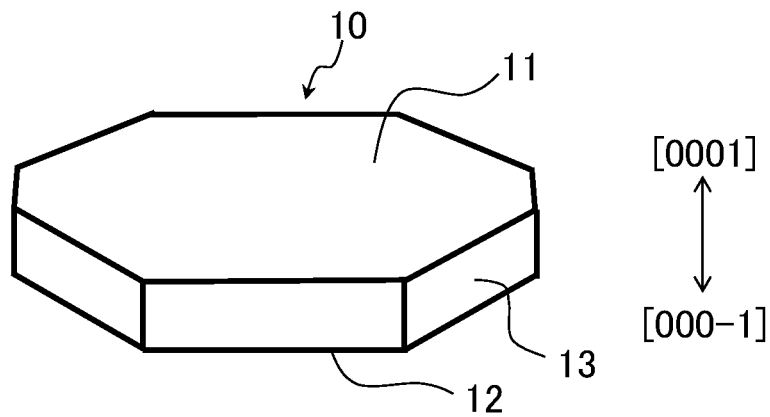

FIGS. 2A to 2C are perspective views each illustrating other shapes which a conductive C-plane GaN substrate according to the embodiment may have. In FIGS. 2A to 2C, constituents corresponding to those illustrated in FIGS. 1A and 1B are allotted with the same reference signs as those in FIGS. 1A to 1C (the same is true for FIG. 3 to be described later).

In FIGS. 2A to 2C, the shapes of the main surfaces (the gallium polar surface 11 and the nitrogen polar surface 12) of the conductive C-plane GaN substrate 10 are quadrangular, hexagonal, and octagonal, respectively.

The main surface of the conductive C-plane GaN substrate according to the embodiment preferably has an area of 15 cm$^2$ or more and may for example have an area of 15 cm$^2$ or more and less than 50 cm$^2$, 50 cm$^2$ or more and less than 100 cm$^2$, 100 cm$^2$ or more and less than 200 cm$^2$, 200 cm$^2$ or more and less than 350 cm$^2$, 350 cm$^2$ or more and less than 500 cm$^2$, or 500 cm$^2$ or more and less than 750 cm$^2$.

In the conductive C-plane GaN substrate of the embodiment, the gallium polar surface has an orientation of within 10° from [0001]. In other words, the angle formed between a normal vector of the gallium polar surface and [0001] is within 10°.

When the normal vector of the gallium polar surface is tilted from [0001], a preferred tilt direction is within a range of ±10° from any one of the m-axis direction and the a-axis direction, but is not limited thereto.

In the conductive C-plane GaN substrate of the embodiment, the gallium polar surface has an orientation of preferably within 5° and more preferably within 2° from [0001]. The orientation may be within 1° from [0001].

In the conductive C-plane GaN substrate according to the embodiment, the nitrogen polar surface has an orientation of within 10°, preferably within 5°, and more preferably within 2° from [000-1]. The orientation may be within 1° from [000-1].

When a normal vector of the nitrogen polar surface is tilted from [000-1], a preferred tilt direction is within a range of ±10° from any one of the m-axis direction and the a-axis direction, but is not limited thereto.

The gallium polar surface and the nitrogen polar surface are preferably parallel to each other, but are not limited thereto.

When the conductive C-plane GaN substrate of the embodiment is disk-shaped, the substrate has a diameter of for example not less than 45 mm and not more than 305 mm. The diameter is typically from 45 to 55 mm (about 2 inches), from 95 to 105 mm (about 4 inches), from 145 to 155 mm (about 6 inches), from 195 to 205 mm (about 8 inches), from 295 to 305 mm (about 12 inches), or the like.

When the conductive C-plane GaN substrate of the embodiment has a rectangular main surface, length and width of the main surface may each be for example 5 cm or more and 15 cm or less.

The thickness of the conductive C-plane GaN substrate according to the embodiment is preferably 100 μm or more and may be for example 150 μm or more and less than 250 μm, 250 μm or more and less than 300 μm, 300 μm or more and less than 400 μm, 400 μm or more and less than 500 μm, 500 μm or more and less than 750 μm, 750 μm or more and less than 1 mm, 1 mm or more and less than 2 mm, or 2 mm or more and less than 5 mm. The thickness has no particular upper limit, but is usually 20 mm or less.

In the conductive C-plane GaN substrate of the embodiment, the boundary between the gallium polar surface and the side surface may be chamfered. The same is true for the boundary between the nitrogen polar surface and the side surface.

The the conductive C-plane GaN substrate according to the embodiment may be provided with various markings as necessary, such as an orientation flat or notch representing a crystal orientation and an index flat for facilitating discrimination between the gallium polar surface and the nitrogen polar surface.

1.2. Electrical Properties

The resistivity of the conductive C-plane GaN substrate according to the embodiment at room temperature is preferably $2.0 \times 10^{-2}$ Ω·cm or less.

From the viewpoint of electrical properties, there is no lower limit on the resistivity. When it is necessary to particularly consider effects of dopant addition on the quality of the GaN crystal forming the substrate, the resistivity is set to preferably $2 \times 10^{-3}$ Ω·cm or more and more preferably $5 \times 10^{-3}$ Ω·cm or more.

In the conductive C-plane GaN substrate according to the embodiment, the n-type carrier concentration at room temperature determined based on measurement of the Hall effect by the van der Pauw method is preferably $1 \times 10^{18}$ cm$^{-3}$ or more, more preferably $2 \times 10^{18}$ cm$^{-3}$ or more, and more preferably $3 \times 10^{18}$ cm$^{-3}$ or more. The n-type carrier concentration may be $5 \times 10^{18}$ cm$^{-3}$ or more.

From the viewpoint of electrical properties, there is no upper limit on the carrier concentration. When it is necessary to particularly consider effects of dopant addition on the quality of the GaN crystal forming the substrate, the carrier concentration is set to preferably $1 \times 10^{20}$ cm$^{-3}$ or less, more preferably $5 \times 10^{19}$ cm$^{-3}$ or less, and more preferably $2 \times 10^{19}$ cm$^{-3}$ or less.

In one example, the above-described resistivity and carrier concentration may be set such that the Hall mobility is preferably 120 cm$^2$/V·s or more and more preferably 150 cm$^2$/V·s or more.

1.3. Impurity

Generally, concentrations of various impurities contained in a GaN crystal are measured by SIMS (Secondary Ion Mass Spectrometry). Impurity concentrations as will be mentioned below are values measured by SIMS at a depth of 1 μm or more from a substrate surface.

The n-type impurity which may be contained in the conductive C-plane GaN substrate of the embodiment is not limited and may for example be O (oxygen), Si (silicon), Ge (germanium), and S (sulfer).

In one example, the conductive C-plane GaN substrate of the embodiment may have a higher O concentration than an n-type carrier concentration at room temperature, and in such a case, the carrier concentration is usually from 20 to 70% of the O concentration.

When the conductive C-plane GaN substrate according to the embodiment contains 0, the ratio between the maximum and minimum values of the O concentration measured on the main surface is preferably less than 10. It is noted, for reference, that when a C-plane GaN substrate comprising a GaN crystal grown in the [0001] direction has on the main surface a region formed by crystal growth on a C-plane facet and a region formed by crystal growth on a non-C-plane facet, the O concentration differs between the regions usually by 10 times or more, and the difference reaches as much as 100 times or more when large.

In the conductive C-plane GaN substrate of the embodiment, concentrations of alkaline metals and alkaline earth metals are preferably less than $1 \times 10^{16}$ atoms/cm$^3$ and more preferably less than $1 \times 10^{15}$ atoms/cm$^3$.

The conductive C-plane GaN substrate of the embodiment may comprise a GaN crystal ammonothermally grown in a capsule made of Pt (platinum) using ammonium halide such as NH$_4$F, NH$_4$Cl (ammonium chloride), NH$_4$Br (ammonium bromide), and NH$_4$I, as a mineralizer. In such a GaN crystal, the concentration of each of alkaline metal elements such as Li (lithium), Na (sodium), and K (potassium) and alkaline earth metal elements such as Mg (magnesium) and Ca (calcium) is usually less than $1 \times 10^{16}$ atoms/cm$^3$, unless intentionally added.

A GaN crystal ammonothermally grown using ammonium halide as a mineralizer may contain a halogen derived from the mineralizer. For example, a GaN crystal grown using NH$_4$F as a mineralizer may contain F (fluorine) at a concentration of $5 \times 10^{14}$ atoms/cm$^3$ or more and less than $1 \times 10^{16}$ atoms/cm$^3$, $1 \times 10^{16}$ atoms/cm$^3$ or more and less than $1 \times 10^{17}$ atoms/cm$^3$, or the like.

Experiments by the present inventors have confirmed that a GaN crystal ammonothermally grown using NH$_4$F and NH$_4$I as mineralizers usually has an I (iodine) concentration of less than $1 \times 10^{16}$ atoms/cm$^3$.

A GaN crystal ammonothermally grown using ammonium halide as a mineralizer may contain H (hydrogen) at a concentration of $5 \times 10^{17}$ atoms/cm$^3$ or higher. The H concentration in such a GaN crystal is usually $10^{21}$ atoms/cm$^3$ or less and may be $5 \times 10^{20}$ atoms/cm$^3$ or less, $1 \times 10^{20}$ atoms/cm$^3$ or less, or $5 \times 10^{19}$ atoms/cm$^3$ or less.

Generally, an ammonothermally grown GaN crystal has an infrared absorption peak attributable to a gallium vacancy-hydrogen complex within a range of 3140 to 3200 cm$^{-1}$. No such infrared absorption peak is observed in GaN crystals grown by HVPE methods or Na flux methods.

1.4. Crystallinity

At least one first line segment which is a virtual line segment with a length of 40 mm can be drawn at least on one main surface of the conductive C-plane GaN substrate according to the embodiment, and the first line setment satisfies at least one, preferably both of the following conditions (A1) and (B1).

(A1) When an XRC of the (004) reflection is measured at 1 mm intervals on the first line segment with a plane of incidence of X-rays parallel to the first line segment in each co scan, a maximum value of XRC-FWHMs across all the measurement points is less than 30 arcsec.

(B1) When an XRC of the (004) reflection is measured at 1 mm intervals on the first line segment with a plane of incidence of X-rays parallel to the first line segment in each co scan, a difference between maximum and minimum values of XRC peak angles across all the measurement points is less than 0.2°.

The term "XRC" mentioned here refers to an X-ray Rocking Curve (or X-ray diffraction Rocking Curve). In XRC measurement of a GaN crystal, CuKα is usually used as a radiation source.

The XRC-FWHM (Full Width at Half Maximum of an XRC) is an index generally used for evaluation of crystal quality.

The difference between maximum and minimum values of XRC peak angles specified in the condition (B1) is an index representing how much the c-axis direction varies on the first line segment.

In a preferred example, the first line segment satisfies, in addition to the condition (A1), the following condition (A2).

(A2) An average value of the XRC-FWHMs across all the measurement points on the first line segment obtained by the XRC measurement as specified in the condition (A1) is less than 20 arcsec.

In a more preferred example, the first line segment satisfies, in addition to the condition (A1), the following condition (A3).

(A3) An average value and a standard deviation of the XRC-FWHMs across all the measurement points on the first line segment obtained by the XRC measurement as specified in the condition (A1) are less than 12 arcsec and less than 5 arcsec, respectively.

In the conductive C-plane GaN substrate of the embodiment, it is only necessary that the first line segment can be drawn on at least one of the gallium polar surface and the nitrogen polar surface. In some cases, one of the main surfaces may have been roughly finished and be unsuitable for XRC measurement. In a substrate in which both main surfaces are finished to allow XRC measurement, it is often the case that if the first line segment can be drawn on one main surface, the first line segment can also be drawn on the other main surface.

Desirably, at least one of the first line segments which can be drawn on a main surface of the conductive C-plane GaN substrate according to the embodiment passes through the center (center of gravity) of the main surface, but it is not limited thereto.

In the conductive C-plane GaN substrate of the embodiment, it is desirable that at least one second line segment which is a virtual line segment with a length of 40 mm can be drawn on the main surface on which the first line segment can be drawn and that the second line segment satisfies at least one, preferably both of the following conditions (C1) and (D1).

(C1) The second line segment is orthogonal to at least one of the first line segment, and when an XRC of the (004) reflection is measured at 1 mm intervals on the second line segment with a plane of incidence of X-rays parallel to the second line segment in each co scan, a maximum value of XRC-FWHMs across all the measurement points is less than 30 arcsec.

(D1) The second line segment is orthogonal to at least one of the first line segment, and when an XRC of the (004) reflection is measured at 1 mm intervals on the second line segment with a plane of incidence of X-rays parallel to the second line segment in each co scan, a difference between maximum and minimum values of XRC peak angles across all the measurement points is less than 0.2°.

In a preferred example, the second line segment satisfies, in addition to the condition (C1), the following condition (C2).

(C2) An average value of the XRC-FWHMs across all the measurement points on the second line segment obtained by the XRC measurement as specified in the condition (C1) is less than 20 arcsec.

In a more preferred example, the second line segment satisfies, in addition to the condition (C1), the following condition (C3).

(C3) An average value and a standard deviation of the XRC-FWHMs across all the measurement points on the second line segment obtained by the XRC measurement as specified in the condition (C1) are less than 12 arcsec and less than 5 arcsec, respectively.

Desirably, at least one of the second line segments which can be drawn on the main surface of the conductive C-plane GaN substrate according to the embodiment passes through the center (center of gravity) of the main surface, but it is not limited thereto.

Figure 3:
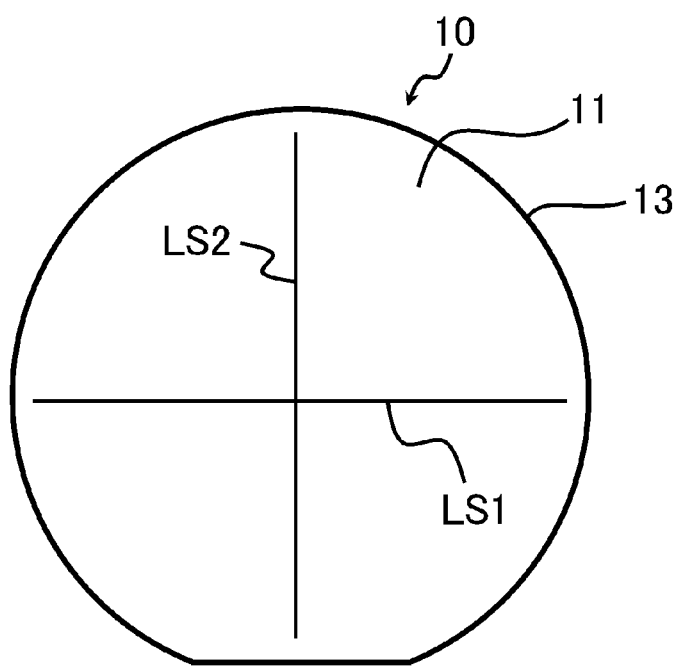
FIG. 3 is a plan view illustrating a conductive C-plane GaN substrate according to an embodiment.

FIG. 3 illustrates one example of a conductive C-plane GaN substrate having a main surface on which two line segments respectively corresponding to the first line segment and the second line segment can be drawn.

The conductive C-plane GaN substrate 10 illustrated in FIG. 3 is disk-shaped and has a diameter in a range of 45 to 55 mm. The conductive C-plane GaN substrate 10 has the gallium polar surface 11 on which a line segment LS1 corresponding to the first element and a line segment LS2 corresponding to the second line segment can be drawn.

The line segments LS1 and LS2, which are orthogonal to each other, each has a length of 40 mm and passes through an approximate center of the gallium polar surface 11. Each of the line segments LS1 and LS2 intersects with the other line segment at a midpoint thereof.

An XRC of the (004) reflection can be measured at 1 mm intervals on the line segment LS1 with a plane of incidence of X-rays parallel to the line segment LS1 in each co scan. When a plane of incidence of X-rays is parallel to the line segment LS1, the incident direction of X-rays onto the C-plane GaN substrate 10 is parallel to a plane which includes the line segment LS1 and is perpendicular to the C-plane.

A maximum value of XRC-FWHMs across 40 measurement points on the line segment LS1 obtained by such XRC measurement is less than 30 arcsec, preferably less than 25 arcsec, and more preferably less than 20 arcsec.

An average value of the XRC-FWHMs across the 40 measurement points is preferably less than 20 arcsec, more preferably less than 16 arcsec, and more preferably less than 12 arcsec.

Further preferably, an average value of the XRC-FWHMs across the 40 measurement points is less than 12 arcsec, with a standard deviation of less than 5 arcsec.

A difference between maximum and minimum values of the XRC peak angles across the 40 measurement points is preferably less than 0.2°, more preferably less than 0.15°, and more preferably less than 0.1°.

XRC-FWHMs of the (004) reflection can be measured at 1 mm intervals on the line segment LS2 with a plane of incidence of X-rays parallel to the line segment LS2 in each ω scan. When a plane of incidence of X-rays is parallel to the line segment LS2, the incident direction of X-rays onto the C-plane GaN substrate 10 is parallel to a plane which includes the line segment LS2 and is perpendicular to the C-plane.

A maximum value of XRC-FWHMs across 40 measurement points on the line segment LS2 obtained by such XRC measurement is less than 30 arcsec, preferably less than 25 arcsec, and more preferably less than 20 arcsec.

An average value of the XRC-FWHMs across the 40 measurement points is preferably less than 20 arcsec, more preferably less than 16 arcsec, and more preferably less than 12 arcsec.

Further preferably, an average value of the XRC-FWHMs across the 40 measurement points is less than 12 arcsec, with a standard deviation of less than 5 arcsec.

A difference between the maximum and minimum values of the XRC peak angles across the 40 measurement points is preferably less than 0.2°, more preferably less than 0.15°, and more preferably less than 0.1°.

1.5. Dislocation Array

The conductive C-plane GaN substrate according to the embodiment may have a lined-up group of dislocations, namely a dislocation array, on a main surface thereof. The dislocation mentioned here refers to an endpoint of a threading dislocation (an edge dislocation, a screw dislocation, and a mixed dislocation).

On a main surface of the conductive C-plane GaN substrate according to the embodiment, a plurality of the dislocation arrays may be periodically arranged. The arrangement of the plurality of the dislocation arrays may be two-dimensional and may further have periodicity in two or more directions.

The presence or absence, shape, arrangement, and the like of a linear dislocation array on a main surface of a C-plane GaN substrate is confirmable with an optical microscope by etching the main surface under suitable conditions to form etch pits at endpoints of threading dislocations. It is only necessary to make confirmation at least on one of the gallium polar surface and the nitrogen polar surface.

For example, in the case of the gallium polar surface, by etching the surface for 1 hour or longer using 89% sulfuric acid heated to 270° C. as an etchant, etch pits corresponding to all kinds of threading dislocations present on the surface can be formed.

The conductive C-plane GaN substrate of the embodiment may have a plurality of the dislocation arrays periodically arranged on a main surface thereof, for example, when a GaN crystal growth method of section 2.1. to be described later is employed for the growth of a GaN crystal forming the substrate, or when the GaN crystal growth method of section 2.1. to be described later is employed for the production of a GaN seed used in growing the GaN crystal forming the substrate.

1.6. Use (1) Nitride Semiconductor Device

The conductive C-plane GaN substrate of the embodiment may be preferably used for production of nitride semiconductor devices.

Usually, one or more nitride semiconductors are epitaxially grown on the conductive C-plane GaN substrate to form an epitaxial substrate provided with a semiconductor device structure. Preferably usable epitaxial growth methods include, without limitation, an MOCVD method, an MBE method, and a pulse deposition method, which are vapor phase methods suitable for forming thin films.

The semiconductor device structure is formed on the above-described main surface on which the first line segment can be drawn.

After being subjected to semiconductor processing including etching and provision with structures such as electrodes and protective films, the epitaxial substrate is divided into nitride semiconductor device chips.

Specific examples of the nitride semiconductor device which can be produced using the conductive C-plane GaN substrate of the embodiment include light emitting devices such as light emitting diodes and laser diodes, electronic devices, such as rectifiers, bipolar transistors, field effect transistors, and HEMTs (High Electron Mobility Transistors), semiconductor sensors such as temperature sensors, pressure sensors, radiation sensors, and visible-ultraviolet light detectors, and solar cells.

In addition, the conductive C-plane GaN substrate of the embodiment may be also used for applications such as SAW (Surface Acoustic Wave) devices, vibrators, resonators, oscillators, MEMS (Micro Electro Mechanical System) components, voltage actuators, and electrodes for artificial photosynthetic devices.

(2) GaN Layer-Bonded Substrate

In one example, the conductive C-plane GaN substrate according to the embodiment may be used to produce GaN layer-bonded substrates.

A GaN layer-bonded substrate is a composite substrate having a structure in which a GaN layer is bonded to a heterogeneous substrate having a chemical composition different from that of GaN, and may be used for producing light emitting devices and other semiconductor devices. Examples of the heterogeneous substrate include sapphire substrates, AlN substrates, SiC substrates, ZnSe substrates, Si substrates, ZnO substrates, ZnS substrates, quartz substrates, spinel substrates, carbon substrates, diamond substrates, $Ga_2O_3$ substrates, $ZrB_2$ substrates, Mo substrates, W substrates, and ceramic substrates.

With regard to details of the structure, production methods, applications, and others of GaN layer-bonded substrates, reference may be made to, for example, JP-A-2006-210660 and JP-A-2011-44665.

A GaN layer-bonded substrate is typically produced by performing, in the order mentioned below, the steps of implanting ions into the vicinity of a main surface of a GaN substrate, bonding the main surface side of the GaN substrate to a heterogeneous substrate, and separating the GaN substrate at the ion-implanted region as a boundary into two parts to thereby form a GaN layer bonded to the heterogeneous substrate.

As a method for producing a GaN layer-bonded substrate without ion implantation, there has also been developed a method where a GaN substrate is bonded to a heterogeneous substrate and the GaN substrate is then mechanically cut to form a GaN layer bonded to the heterogeneous substrate.

When the conductive C-plane GaN substrate of the embodiment is used as a material, any one of these production methods provides a GaN layer-bonded substrate having a structure in which a GaN layer separated from the C-plane GaN substrate is bonded to a heterogeneous substrate.

(3) Seed

The conductive C-plane GaN substrate of the embodiment may be preferably used for the production of a bulk nitride semiconductor crystal, in particular a bulk GaN crystal.

Specifically, the conductive C-plane GaN substrate according to the embodiment may be used as a seed in growing bulk nitride semiconductor crystals by various methods.

Examples of preferably usable methods for growing a bulk nitride semiconductor crystal include a THVPE (Tri-Halide Vapor Phase Epitaxy) method and an OVPE (Oxide Vapor Phase Epitaxy) method, in addition to an HVPE (Hydride Vapor Phase Epitaxy) method, a sublimation method, an ammonothermal method, and a Na flux method.

With regard to details of a THVPE method, which is a vapor phase growth method of a nitride semiconductor crystal using a trichloride of a Group 13 element such as $GaCl_3$ and $AlCl_3$ and a nitrogen-containing compound such as $NH_3$ as raw materials, reference may be made to, for example, WO2015/037232. In the production of a bulk GaN crystal using a THVPE method, a GaN crystal is epitaxially grown on the nitrogen polar surface of the conductive C-plane GaN substrate of the embodiment.

With regard to details of an OVPE method, which is a vapor phase growth method of GaN using $Ga_2O$ and $NH_3$ as raw materials, reference may be made to, for example, M. Imade, et al., Journal of Crystal Growth, 312 (2010) 676-679.

2. PRODUCTION METHOD OF CONDUCTIVE C-PLANE GAN SUBSTRATE

2.1. GaN Crystal Growth Method

Figure 4:
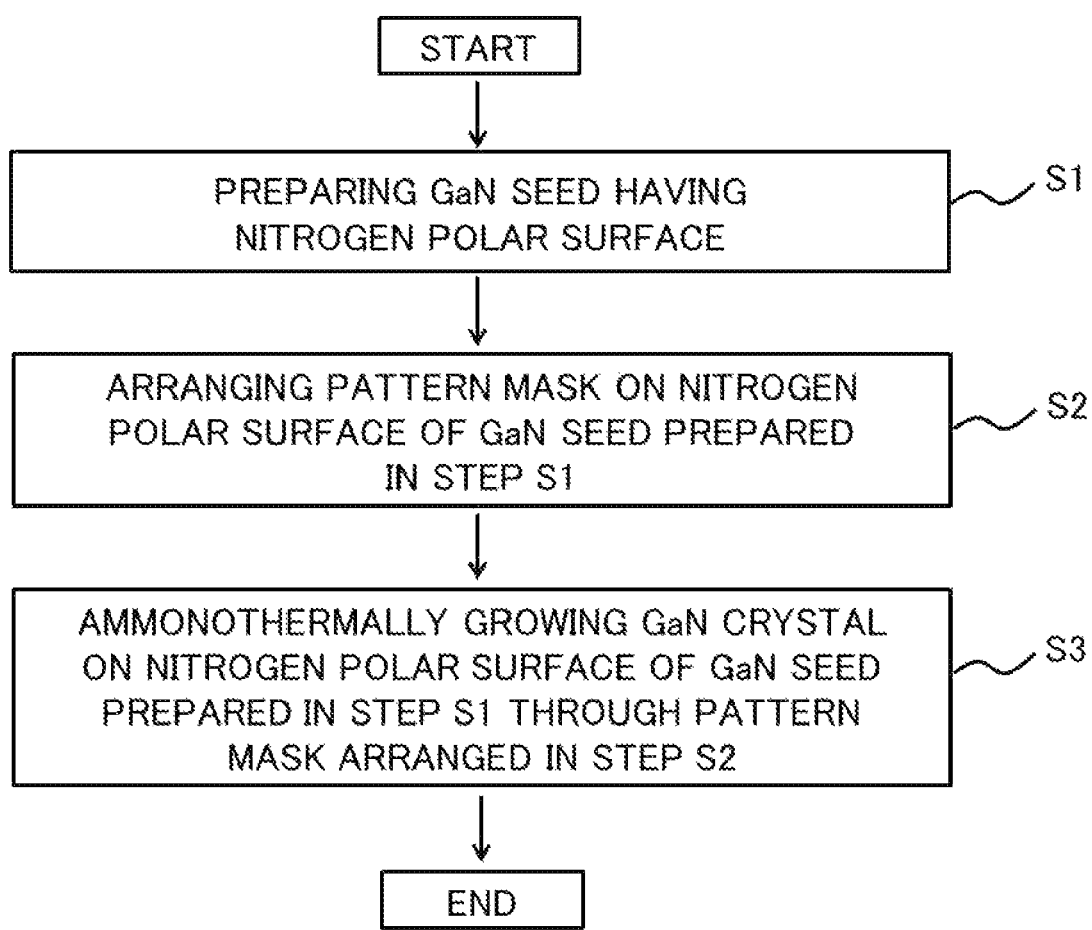
FIG. 4 shows a flow chart of a GaN crystal growth method.

A GaN crystal growth method which is preferably usable for producing the conductive C-plane GaN substrate according to the embodiment will be described. As shown in a flow chart in FIG. 4, the GaN crystal growth method includes the following three steps S1-S3.

S1: preparing a GaN seed having a nitrogen polar surface.

S2: arranging a pattern mask on the nitrogen polar surface of the GaN seed prepared in the step S1.

S3: ammonothermally growing a GaN crystal on the nitrogen polar surface of the GaN seed prepared in the step S1 through the pattern mask arranged in the step S2.

Details of the steps will be described below.

(1) Step S1

In the step S1, a GaN seed having a nitrogen polar surface is prepared.

A preferred GaN seed is a C-plane GaN substrate obtained by processing a bulk GaN crystal grown by an HVPE method or an acidic ammonothermal method, and may be made of a bulk GaN crystal grown by the method described in section 2.1. here. In a C-plane GaN substrate, a main surface on the side is a gallium polar surface, and another main surface on the [000-1] side is a nitrogen polar surface.

The nitrogen polar surface of the GaN seed has an orientation of preferably within 2° from [000-1] and more preferably within 1° from [000-1].

The nitrogen polar surface of the GaN seed has an area of preferably 15 $cm^2$ or more and may for example have an area of 15 $cm^2$ or more and less than 50 $cm^2$, 50 $cm^2$ or more and less than 100 $cm^2$, 100 $cm^2$ or more and less than 200 $cm^2$, 200 $cm^2$ or more and less than 350 $cm^2$, 350 $cm^2$ or more and less than 500 $cm^2$, or 500 $cm^2$ or more and less than 750 $cm^2$.

When the nitrogen polar surface of the GaN seed is circular, the surface has a diameter of preferably 45 mm or more. The diameter is typically from 45 to 55 mm (about 2 inches), from 95 to 105 mm (about 4 inches), from 145 to 155 mm (about 6 inches), from 195 to 205 mm (about 8 inches), from 295 to 305 mm (about 12 inches), or the like.

For example, when the GaN seed is a C-plane GaN substrate with a diameter of 50 mm, its thickness is preferably 300 µm or more, and when with a larger diameter, a preferred lower limit value of its thickness is also greater. The thickness of the GaN seed has no particular upper limit, but is usually 20 mm or less.

The size of the GaN seed is determined in consideration of the size of the GaN crystal to be grown in the later step S3.

For example, when it is intended to cut out, from a GaN crystal to be grown, a C-plane GaN substrate whose size is 45 mm in all of the [1-100] direction, the [10-10] direction, and the [01-10] direction, the GaN crystal has to be grown to have a size of 45 mm or more in all of the [1-100] direction, the [10-10] direction, and the [01-10] direction. To grow a GaN crystal whose size is 45 mm in all of the [1-100] direction, the [10-10] direction, and the [01-10] direction, it is preferable to use a GaN seed whose size is 45 mm or more in all of the [1-100] direction, the [10-10] direction, and the [01-10] direction.

The nitrogen polar surface of the GaN seed is planarized by polishing or grinding. Preferably, by CMP (Chemical Mechanical Polishing) and/or etching, a damaged layer introduced by the planarization process is removed from the nitrogen polar surface.

(2) Step S2

In the step S2, a pattern mask is arranged on the nitrogen polar surface of the GaN seed prepared in the step S1.

The material to form the surface of the pattern mask is preferably a metal selected from platinum-group metals, namely, Ru (ruthenium), Rh (rhodium), Pd (palladium), Os (osmium), Ir (iridium), and Pt (platinum), and the material is particularly preferably Pt. While the pattern mask may be a single layer film made of a platinum-group metal or its alloy, the pattern mask is preferably a multilayer film formed by laminating a platinum-group metal layer as a surface layer on a base layer made of a metal with a better adhesion to a GaN crystal than that of platinum-group metals. Examples of the material for the base layer include, without limitation, W (tungsten), Mo (molybdenum), Ti (titanium), and alloys containing at least one selected from these.

The pattern mask is provided with a periodical opening pattern comprising linear openings. One example will be described referring to FIGS. 5A and 5B and 6.

Figure 5A:
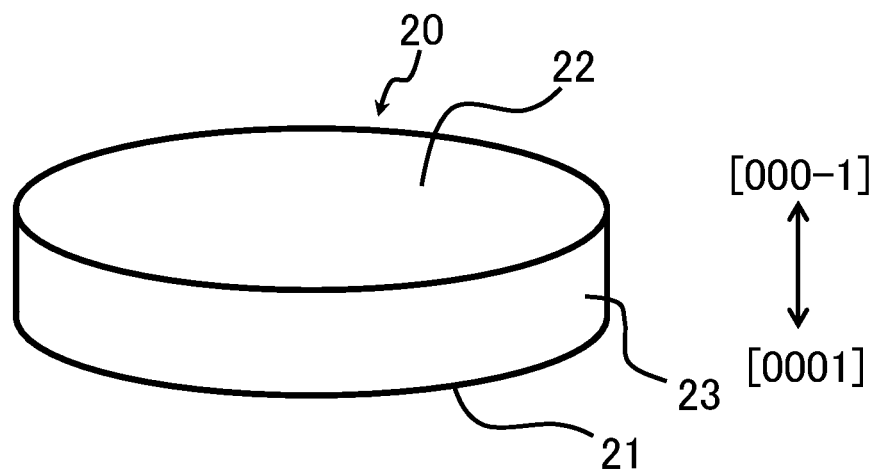
FIG. 5A is a perspective view illustrating a GaN seed.

FIG. 5A is a perspective view illustrating a GaN seed. A GaN seed 20 is a disc-shaped C-plane GaN substrate which has a gallium polar surface 21, a nitrogen polar surface 22, and a side surface 23.

Figure 5B:
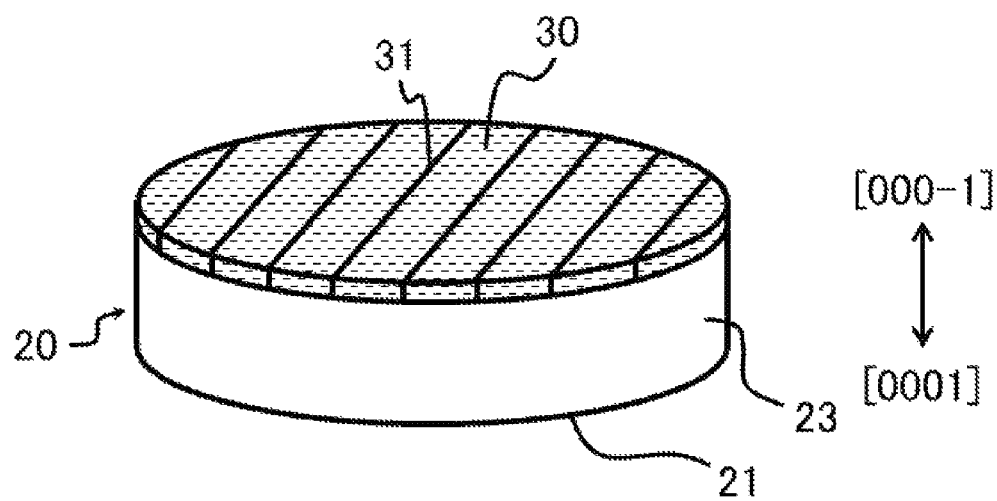
FIG. 5B is a perspective view illustrating the GaN seed after arrangement of a pattern mask on the nitrogen polar surface.

FIG. 5B is a perspective view illustrating the GaN seed 20 after arrangement of a pattern mask 30 on the nitrogen polar surface 22. The pattern mask 30 is provided with a plurality of linear openings 31 arranged parallel to each other. The periodical opening pattern formed by the linear openings 31 is a stripe pattern.

Figure 6:
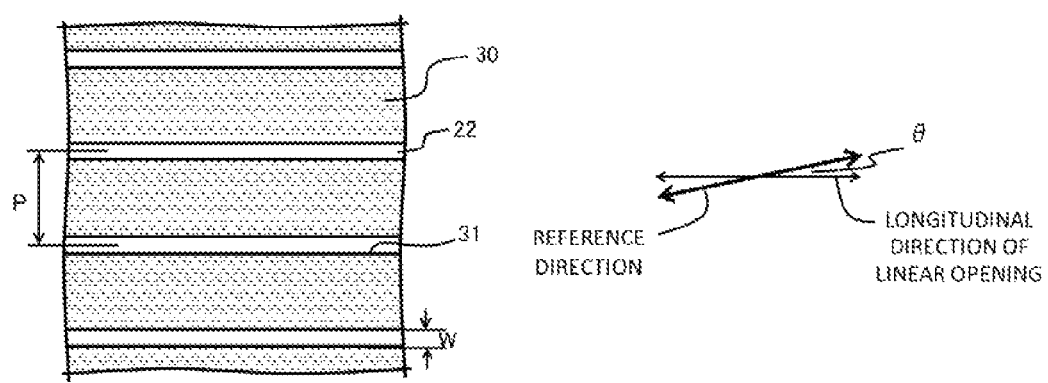
FIG. 6 is a plan view illustrating part of a nitrogen polar surface side of a GaN seed after arrangement of a pattern mask.

FIG. 6 is a plan view illustrating part of the nitrogen polar surface 22 side of the GaN seed 20 after arrangement of the pattern mask 30.

Referring to FIG. 6, the pattern mask 30 is provided with a plurality of the linear openings 31 parallel to each other at a constant pitch P, and the nitrogen polar surface 22 of the GaN seed 20 is exposed inside each linear opening 31. The pitch means a distance between center lines of parallel linear openings adjacent to each other across a non-opening part of a pattern mask.

In order to reduce dislocation defects which a GaN crystal to be grown in the later step S3 will inherit from the GaN seed 20, it is advantageous that the line width W of the linear opening 31 is narrow. Thus, the line width W is preferably 0.5 mm or less, more preferably 0.2 mm or less, and more preferably 0.1 mm or less.

From the viewpoint of production efficiency, it is preferable that the line width W of the linear opening 31 is moderately wide. That way, during the growth of a GaN crystal in the later step S3, the growth rate at an early stage will be increased. Thus, the line width W is preferably 5 μm or more, more preferably 20 μm or more, and more preferably 40 μm or more.

In order to reduce dislocation defects which a GaN crystal to be grown in the later step S3 will inherit from the GaN seed 20, it is advantageous that the pitch P between the linear openings 31 is large. Thus, the pitch P is preferably 1 mm or more, more preferably 2 mm or more, more preferably 3 mm or more, and more preferably 4 mm or more.

The larger the pitch P between the linear openings 31 is, the longer it takes for through-holes to be created above the non-opening parts of the pattern mask to close when a GaN crystal is grown in the later step S3. Thus, from the viewpoint of production efficiency, the pitch P is preferably 10 mm or less, and may be less than 4 mm, less than 3 mm, or less than 2 mm.

When the direction of an intersection line between the nitrogen polar surface 22 and an M-plane [a (1-100) plane, a (10-10) plane, or a (01-10) plane] in the GaN seed 20 is selected as a reference direction, an angle θ formed between the longitudinal direction of the linear opening 31 and the reference direction is preferably 12°±5°. The angle θ may be 12°±3°, 12°±2°, or 12°±1°. Such orientation of the linear openings facilitates the closure of through-holes to be created above the non-opening parts of the pattern mask when a GaN crystal is grown in the later step S3.

The pattern mask may be provided with a periodical opening pattern which comprises linear openings and includes intersections. One example will be described referring to FIG. 7.

Figure 7:
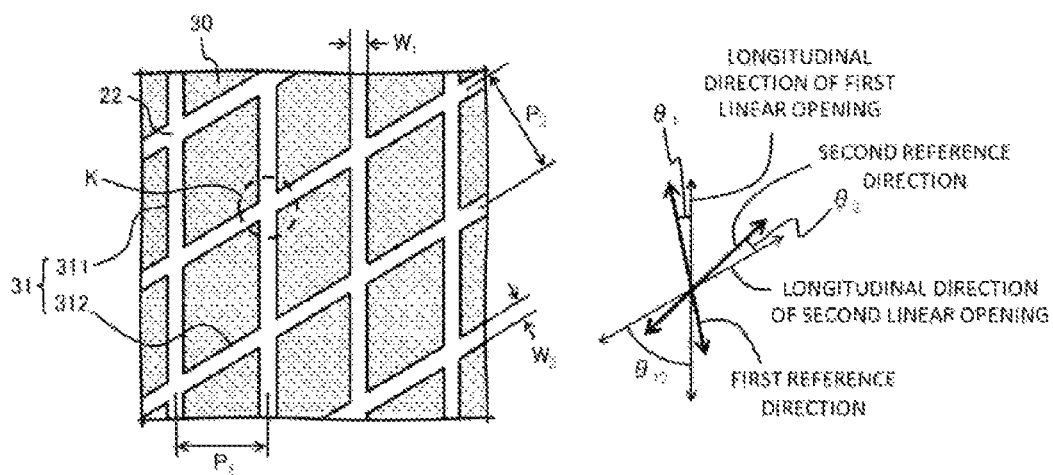
FIG. 7 is a plan view illustrating part of a nitrogen polar surface side of a GaN seed after arrangement of a pattern mask.

FIG. 7 is a plan view illustrating part of the nitrogen polar surface 22 side of the GaN seed 20 after arrangement of the pattern mask 30.

The pattern mask 30 is provided with the linear openings 31, and the nitrogen polar surface 22 of the GaN seed is exposed inside the linear openings 31.

The pattern mask 30 is provided with two kinds of the linear openings 31, that is, a first linear opening 311 and a second linear opening 312 whose longitudinal directions differ from each other. A plurality of the first linear openings 311 and a plurality of the second linear openings 312 form a quadrangular grid pattern.

A pitch $P_1$ between the first linear openings 311 and a pitch $P_2$ between the second linear openings 312 are each constant. The pitch means a distance between center lines of linear openings parallel and adjacent to each other across a non-opening part of a pattern mask.

Although the pitches $P_1$ and $P_2$ may be the same, according to the present inventors' findings from experiments, when the pitches $P_1$ and $P_2$ are different, through-holes created above the non-opening parts of the pattern mask tend to easily close when a GaN crystal is grown in the later step S3. Thus, one of the pitches $P_1$ and $P_2$ is preferably not less than 1.5 times the other and more preferably not less than twice the other.

The quadrangular grid pattern provided on the pattern mask 30 includes an intersection K formed by the first linear opening 311 and the second linear opening 312. As will be described later, provision of intersections to an opening pattern is advantageous in promoting the closure of through-holes to be created above the non-opening parts of the pattern mask when a GaN crystal is grown in the later step S3. From this point of view, preferably, the pattern mask includes intersections at a number density of 1 $cm^{-2}$ or more.

On the other hand, when it is taken into consideration that to increase the number density of the intersections requires to increase the density of the linear openings and that as the density of the linear openings increases, the dislocation defects which a GaN crystal to be grown in the later step S3 will inherit from the GaN seed will increase, the number density of the intersections is preferably 20 $cm^{-2}$ or less, more preferably 15 $cm^{-2}$ or less, and more preferably 10 $cm^{-2}$ or less.

In order to reduce dislocation defects which a GaN crystal to be grown in the later step S3 will inherit from the GaN seed 20, it is advantageous that the first linear opening 311 and the second linear opening 312 have narrow line widths $W_1$ and $W_2$, respectively. Thus, the line widths $W_1$ and $W_2$ are preferably 0.5 mm or less, more preferably 0.2 mm or less, and more preferably 0.1 mm or less. The line widths $W_1$ and $W_2$ may be the same or different.

From the viewpoint of production efficiency, it is preferable that the line width $W_1$ of the first linear opening 311 and the line width $W_2$ of the second linear opening 312 are moderately wide. That way, during the growth of a GaN crystal in the later step S3, the growth rate at an early stage will be increased. Thus, the line widths $W_1$ and $W_2$ are preferably 5 μm or more, more preferably 20 μm or more, and more preferably 40 μm or more.

In order to reduce dislocation defects which a GaN crystal to be grown in the later step S3 will inherit from the GaN seed 20, it is advantageous that the pitch $P_1$ between the first linear openings 311 and the pitch $P_2$ between the second linear openings 312 are large. Thus, the pitches $P_1$ and $P_2$ are preferably 1 mm or more, more preferably 2 mm or more, more preferably 3 mm or more, and more preferably 4 mm or more.

The larger the pitches $P_1$ and $P_2$ are, the longer it takes for through-holes to be created above the non-opening parts of the pattern mask to close when a GaN crystal is grown in the later step S3. Thus, from the viewpoint of production efficiency, it is preferable that at least one of the pitches $P_1$ and $P_2$ is 10 mm or less. In one example, one or both of the pitches $P_1$ and $P_2$ may be less than 4 mm, less than 3 mm, or less than 2 mm.

In a preferred example, taking both reduction of inherited dislocation defects and improvement of production efficiency into consideration, only one of the pitches $P_1$ and $P_2$ may be less than 4 mm, less than 3 mm, or less than 2 mm.

The directions of the first linear opening 311 and the second linear opening 312 are conveniently expressed when one of directions of intersection lines between the nitrogen polar surface 22 and the M-plane is selected as a first reference direction with another one as a second reference direction. For example, when the first reference direction is the direction of the intersection line between the nitrogen polar surface 22 and the (1-100) plane, the second reference direction is the direction of the intersection line between the (10-10) plane or the (01-10) plane and the nitrogen polar surface 22.

In one of preferred examples, at least one of an angle $\theta_1$ formed by the longitudinal direction of the first linear opening 311 with the first reference direction and an angle $\theta_2$ formed by the longitudinal direction of the second linear opening 312 with the second reference direction may be 12°±5°.

When the total length of the first linear openings 311 is equal to or longer than the total length of the second linear openings 312, it is preferable that at least the angle $\theta_1$ is 12°±5°. In other words, it is preferable that longitudinal directions of portions of the linear openings 31 which account for 50% or more of the total length thereof form an angle of 12°±5° with the direction of the intersection line between the nitrogen polar surface and the M-plane of the GaN seed.

In a more preferred example, both of the angles $\theta_1$ and $\theta_2$ are 12°±5°, that is, longitudinal directions of all portions of the linear openings 31 form an angle of 12°±5° with the direction of the intersection line between the nitrogen polar surface and the M-plane of the GaN seed.

The angles $\theta_1$ and $\theta_2$ may be each 12°±3°, 12°±2°, or 12±1°.

The above-described orientation of the linear openings facilitates the closure of through-holes to be created above the non-opening parts of the pattern mask when a GaN crystal is grown in the later step S3.

It is not precluded that any one or both of the angles $\theta_1$ and $\theta_2$ are less than 7°. In one example, any one or both of the angles $\theta_1$ and $\theta_2$ may be ±3°, ±2°, or ±1°, for example. According to the findings by the present inventors, orienting the longitudinal directions of the linear openings substantially parallel to the M-plane of the GaN seed provides an advantageous effect that, when a GaN crystal is grown in the later step S3, threading dislocations are laterally bent in the crystal.

An angle $\theta_{12}$ formed between the first linear opening and the second linear opening may be, for example, 30° or more and less than 45°, 45° or more and less than 75°, or 75° or more and 90° or less. The angle $\theta_{12}$ may be, for example, 60°±10°, 60°±5°, 60°±3° or 60°±1°.

The periodical opening pattern that may be provided on a pattern mask arranged on the nitrogen polar surface of a GaN seed in the step S2 is not limited to the above-described stripe pattern or quadrangular grid pattern.

Diagrams included in FIGS. 8A to 10D are plan views each illustrating the GaN seed 20 after arrangement of the pattern mask 30 on the nitrogen polar surface 22 and giving an example of various periodical opening patterns which may be provided on the pattern mask. Adoptable opening patterns are, however, not limited to these examples.

Figure 8A:
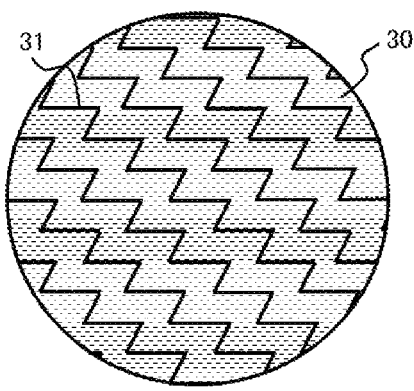
FIGS. 8A to 8D are plan views each illustrating a GaN seed with a pattern mask arranged on the nitrogen polar surface.

In FIG. 8A, the linear openings 31 form a zigzag stripe pattern.

Figure 8C:
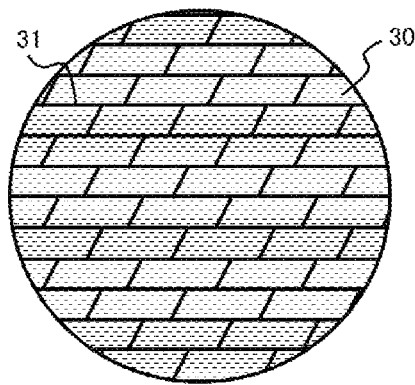
Figure 8B:
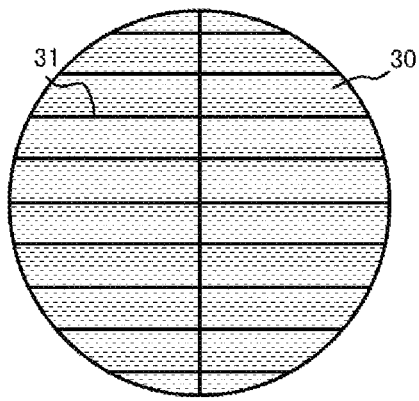

In FIG. 8B, the linear openings 31 form a kind of grid pattern.

In FIG. 8C, the linear openings 31 form a slanted brick grid pattern.

Figure 8D:
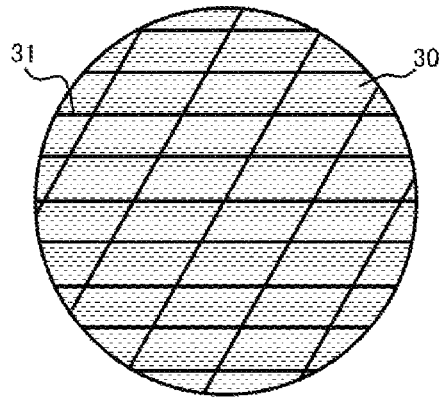

In FIG. 8D, the linear openings 31 form a slanted rectangular grid pattern.

Figure 9A:
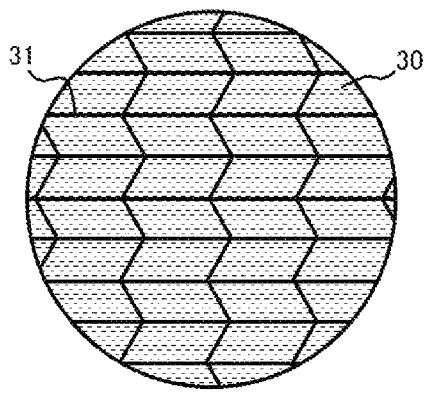
FIGS. 9A to 9D are plan views each illustrating a GaN seed with a pattern mask arranged on the nitrogen polar surface.

In FIG. 9A, the linear openings 31 form a herringbone grid pattern.

Figure 9C:
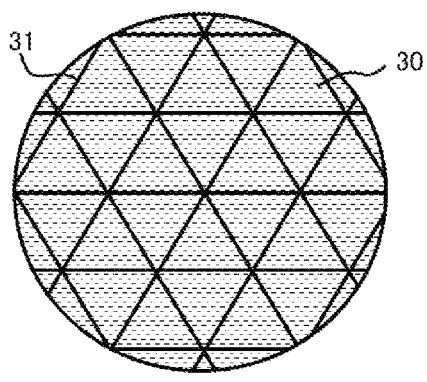
Figure 9B:
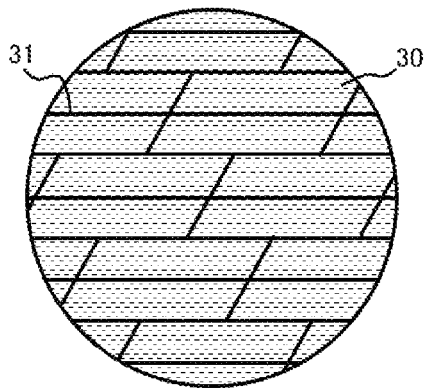

In FIG. 9B, the linear openings 31 form a grid pattern combining slanted brick grid and slanted rectangular grid.

In FIG. 9C, the linear openings 31 form a triangular grid pattern.

Figure 9D:
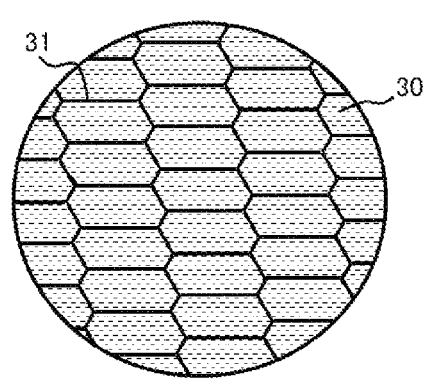

In FIG. 9D, the linear openings 31 form a flat honeycomb grid pattern.

Figure 10A:
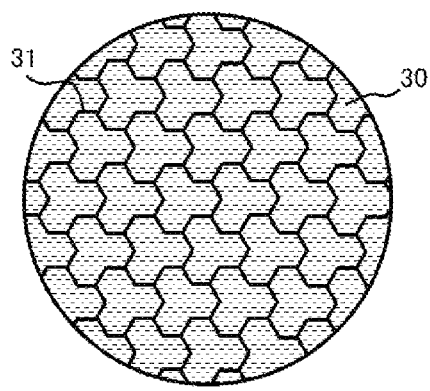
FIGS. 10A to 10D are plan views each illustrating a GaN seed with a pattern mask arranged on the nitrogen polar surface.

In FIG. 10A, the linear openings 31 form a bishamon-kikko pattern.

Figure 10B:
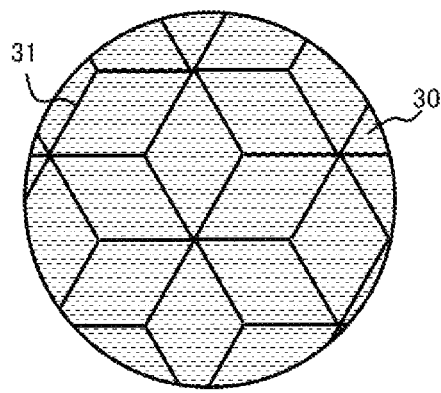
Figure 10C:
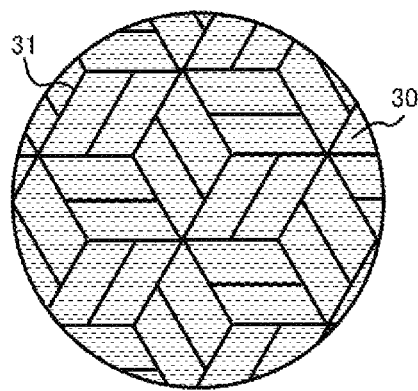

In each of FIGS. 10B and 10C, the linear openings 31 form a cubic pattern.

Figure 10D:
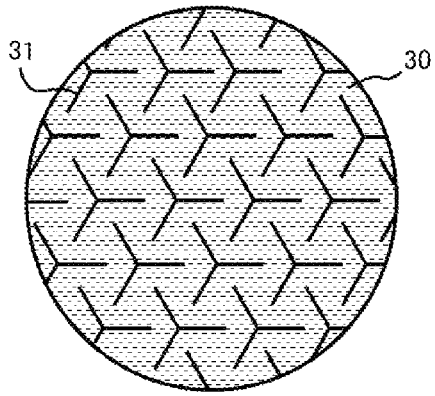
Figure 11A:
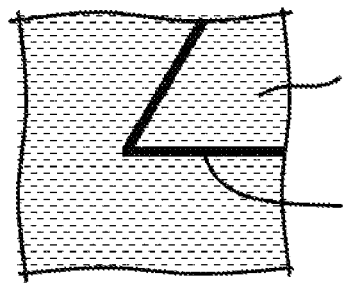
FIGS. 11A to 11F are plan views each illustrating part of a pattern mask formed on a nitrogen polar surface of a GaN seed.
Figure 11B:
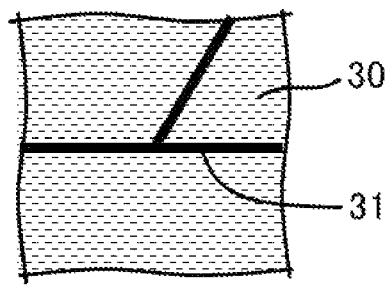
Figure 11C:
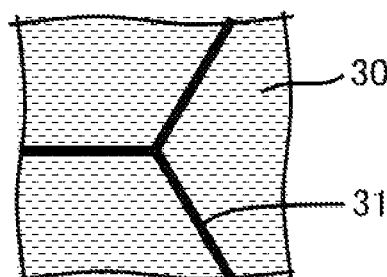
Figure 11D:
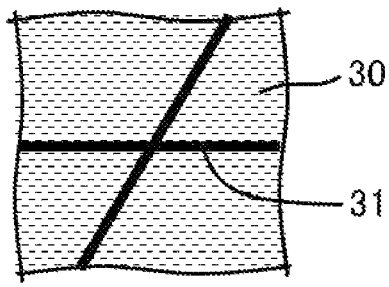
Figure 11E:
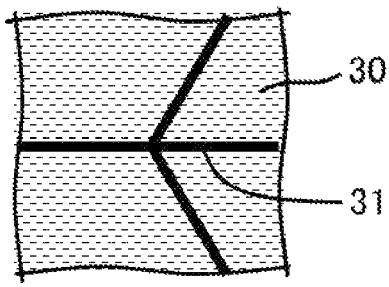
Figure 11F:
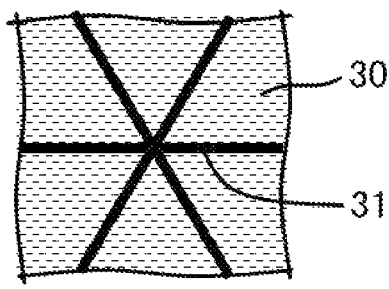
Figure 12A:
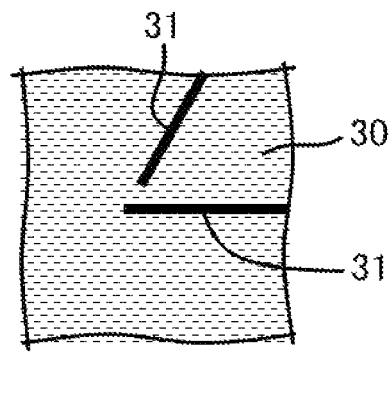
FIGS. 12A to 12F are plan views each illustrating part of a pattern mask formed on a nitrogen polar surface of a GaN seed.
Figure 12B:
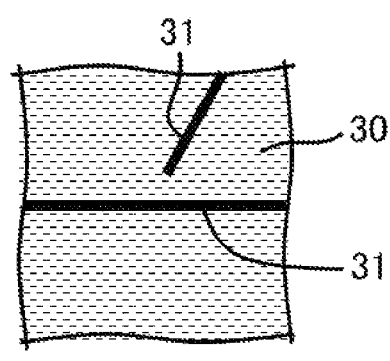
Figure 12C:
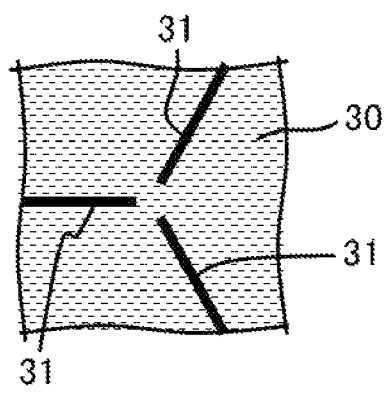
Figure 12D:
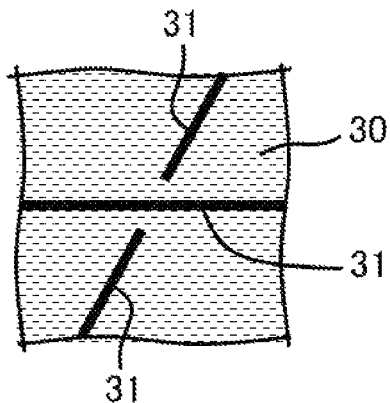
Figure 12E:
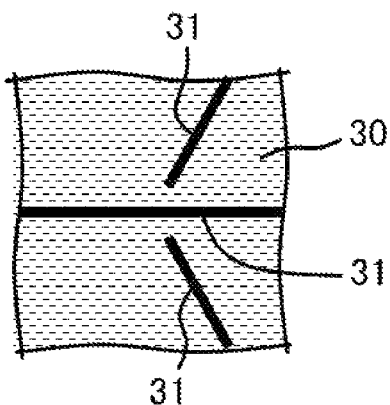
Figure 12F:
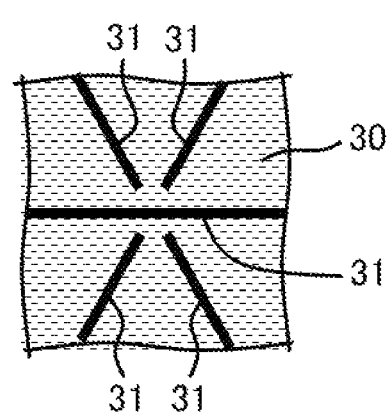

In FIG. 10D, the linear openings 31 form a Y-shaped pattern.

In any of the examples illustrated in FIGS. 8A to 10D, the periodical opening pattern provided on the pattern mask 30 includes intersections. Some types of intersection are shown in FIGS. 11A to 11F and 12A to 12F.

Including those illustrated in FIGS. 11A to 11F, an intersection at which two or more linear openings whose longitudinal directions differ from each other are connected, is herein referred to as a continuous intersection.

Unless otherwise noted, an intersection herein encompasses not only a continuous intersection but also a discontinuous intersection, examples of which are given in FIGS. 12A to 12F. A discontinuous intersection may be considered to be an intersection obtained by modifying a continuous intersection such that the connection between linear openings is disconnected.

In a discontinuous intersection, the distance between two linear openings separated by a non-opening part is 300 μm or less and preferably 200 μm or less.

In FIGS. 8A to 10D, the intersections included in the periodical opening patterns are two-dimensionally arranged in all examples except the example in FIG. 8B.

Inclusion of the intersections in a periodical opening pattern facilitates the closure of through-holes to be created above the non-opening parts of the pattern mask when a GaN crystal is grown in the later step S3. This effect is significant when the arrangement of the intersections in the periodical opening pattern is two-dimensional, and becomes more significant when the number density of the intersections is increased.

Accordingly, it is preferable that the arrangement of the intersections in a periodical opening pattern is two-dimensional, where the pattern mask includes the intersections at a number density of preferably 1 cm$^{-2}$ or more. However, when it is taken into consideration that to increase the number density of the intersections requires to increase the density of the linear openings and that as the density of the linear openings increases, the dislocation defects which a GaN crystal to be grown in the later step S3 will inherit from the GaN seed will increase, the number density of the intersections is preferably 20 cm$^{-2}$ or less, more preferably 15 cm$^{-2}$ or less, and more preferably 10 cm$^{-2}$ or less.

In providing the various periodical opening patterns illustrated in FIGS. 8A to 10D on the pattern masks, the orientation, line widths, and pitches of the linear openings are preferably designed as follows.

It is preferable that longitudinal directions of at least part of the linear openings form an angle of 12°±5° with the direction of the intersection line between the nitrogen polar surface and the M-plane of the GaN seed. More preferably, longitudinal directions of portions of the linear openings which account for 50% or more of the total length thereof, and further preferably longitudinal directions of all portions of the linear openings form an angle of 12±5° with the direction of the intersection line between the nitrogen polar surface and the M-plane of the GaN seed.

The linear openings each have a line width of preferably 0.5 mm or less, more preferably 0.2 mm or less, and more preferably 0.1 mm or less and preferably 5 μm or more, more preferably 20 μm or more, and more preferably 40 μm or more. The line widths need not to be the same in all portions of the linear openings.

When non-opening parts included in a unit pattern of the pattern mask are all quadrangular or all hexagonal, the following applies to the pitch between linear openings.

From the viewpoint of reduction of dislocation defects which a GaN crystal to be grown on the GaN seed will inherit from the GaN seed, the pattern mask preferably does not include any linear openings arranged at a pitch of less than 1 mm, more preferably does not include any linear openings arranged at a pitch of less than 2 mm, more preferably does not include any linear openings arranged at a pitch of less than 3 mm, and more preferably does not include any linear openings arranged at a pitch of less than 4 mm.

On the other hand, from the viewpoint of improvement of production efficiency, the pattern mask preferably includes linear openings arranged at a pitch of 10 mm or less and may include linear openings arranged at a pitch of less than 4 mm, less than 3 mm, or less than 2 mm.

Taking both of the above viewpoints into consideration, the pattern mask may be provided with linear openings arranged at a pitch of 1 mm or more and less than 4 mm and linear openings arranged at a pitch of 4 mm or more, may be provided with linear openings arranged at a pitch of 1 mm or more and less than 3 mm and linear openings arranged at a pitch of 3 mm or more, or may be provided with linear openings arranged at a pitch of 1 mm or more and less than 2 mm and linear openings arranged at a pitch of 2 mm or more. In any of these cases, the pattern mask may be provided with linear openings arranged at a pitch of 4 mm or more.

Among the examples illustrated in FIGS. 8A to 10D, the pattern mask in which all the non-opening parts included in a unit pattern are quadrangular is illustrated in FIGS. 8C, 8D, 9A, 9B, 10B, and 10C. In the example in FIG. 9D where the periodical opening pattern is a flat honeycomb pattern, all the non-opening parts included in a unit pattern of the pattern mask are hexagonal.

(3) Step S3

In the step S3, a GaN crystal is ammonothermally grown on the nitrogen polar surface of the GaN seed prepared in the step S1 through the pattern mask formed in the step S2.

The growth process of the GaN crystal in the step S3 will be described referring to FIGS. 13A to 13E.

Figure 13A:
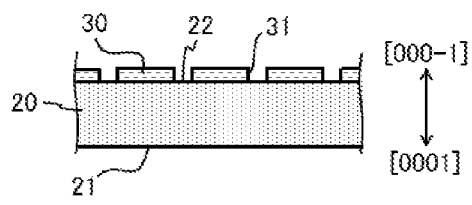
FIGS. 13A to 13E are cross sectional views illustrating the course of the growth of a GaN crystal.

FIG. 13A is a cross-sectional view illustrating the state before the start of crystal growth. The pattern mask 30 having the linear openings 31 is provided on the nitrogen polar surface 22 of the GaN seed 20.

Figure 13B:
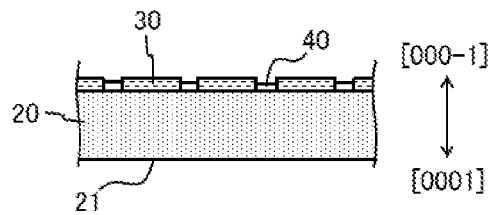

FIG. 13B illustrates a GaN crystal 40 at the beginning of its growth on the nitrogen polar surface 22 exposed inside the linear openings 31 provided in the pattern mask 30.

Figure 13C:
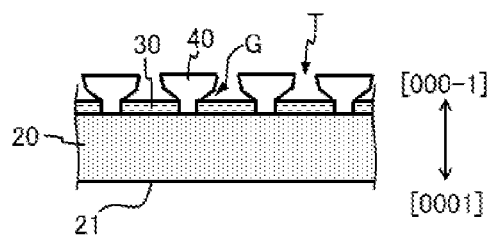

After passing through the pattern mask 30, as FIG. 13C illustrates, the GaN crystal 40 grows not only in the [000-1] direction but also in a lateral direction (a direction parallel to the nitrogen polar surface 22), and gaps G are formed between the GaN crystal 40 and the pattern mask 30. This results in suppression of orientation disorder of the GaN crystal 40, which could be caused by contact with the pattern mask 30.

In the growth stage illustrated in FIG. 13C, the GaN crystal 40 has through-holes T above non-opening parts of the pattern mask 30.

Figure 13D:
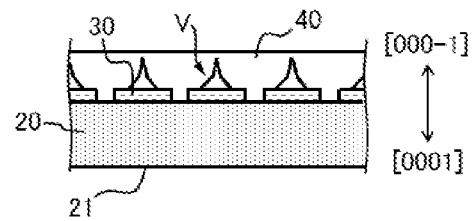

As the GaN crystal 40 further grows, the gaps G are gradually filled but not completely filled up, and as FIG. 13D illustrates, the through-holes T are closed leaving voids V.

Figure 13E:
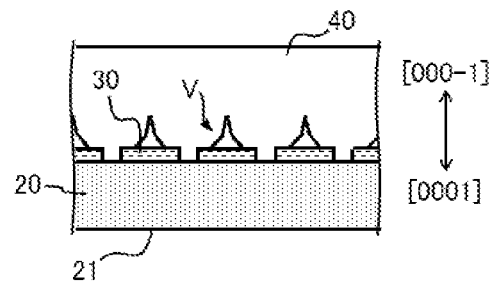

After the through-holes T are closed, the GaN crystal 40 is further grown in the [000-1] direction, as illustrated in FIG. 13E. The voids V are considered to relieve the stress generated between the GaN seed 20 and the GaN crystal 40, thereby reducing the distortion of the GaN crystal 40.

The growth amount of the GaN crystal 40 in the [000-1] direction after the closure of the through-holes T is preferably 1 mm or more, more preferably 2 mm or more, and more preferably 3 mm or more and has no particular upper limit.

Note that in the step S3, the growth of a GaN crystal also occurs on the gallium polar surface 21 of the GaN seed 20, although illustration of which is omitted in FIGS. 13A to 13E.

Either because dislocations have been generated at a coalescence boundary surface or been bent all together in the [000-1] direction at a coalescence boundary surface when the through-holes T close at the stage in FIG. 13D, or for both of these reasons, a dislocation array appears on a main surface of a C-plane GaN substrate cut out from a GaN crystal formed at the stage in FIG. 13E. The shape of the dislocation array is roughly described as the shape of an intersection line formed by an extension of the coalescence boundary surface in the [000-1] direction and the main surface of the C-plane GaN substrate. The intersection may include a straight portion, a curved portion, a bend, and a junction.

Since the coalescence boundary surface is formed above a non-opening part of the pattern mask, when the pattern mask has a plurality of closed non-opening parts, a plurality of dislocation arrays discretely appear on the main surface of the C-plane GaN substrate. When the plurality of closed non-opening parts are in a periodic arrangement in the pattern mask, the plurality of dislocation arrays are also in a periodic arrangement on the main surface of the C-plane GaN substrate. When the plurality of closed non-opening parts are in a two-dimensional arrangement in the pattern mask, the plurality of dislocation arrays are also in a two-dimensional arrangement on the main surface of the C-plane GaN substrate.

The closed non-opening part means a non-opening whose periphery is surrounded by linear openings, and may be referred to as a non-opening part whose outline forms a loop. Among the various examples illustrated in FIGS. 8A to 10D, the pattern mask with closed non-opening parts is illustrated in FIGS. 8C, 8D, 9A-9D, and 10A-10C. In each of these examples, the closed non-opening parts are in a periodical and two-dimensional arrangement in the pattern mask.

The effect the orientation of the linear openings 31 provided in the pattern mask 30 has on the growth of the GaN crystal 40 is described as follows.

According to the present inventors' knowledge obtained through experiments, if the opening pattern provided in the pattern mask 30 is of a stripe type, it is when the longitudinal directions of the linear openings 31 are tilted by about 12° relative to the direction of the intersection line between the nitrogen polar surface 22 and the M-plane that the growth of the GaN crystal 40 most reliably proceeds from the stage in FIG. 13C to the stage in FIG. 13D, in other words, the through-holes T created in the GaN crystal 40 most easily close. When the tilt is brought closer to 0° or closer to 30°, it becomes difficult for the through-holes T to close.

On the other hand, when intersections are introduced to the pattern formed by the linear openings 31, even if the longitudinal directions of the linear openings 31 are parallel to the M-plane or the A-plane, the through-holes T created in the GaN crystal 40 more easily close.

As to the reason for this, the present inventors consider that the re-entrant angle effect to be described below is relevant.

Figure 14A:
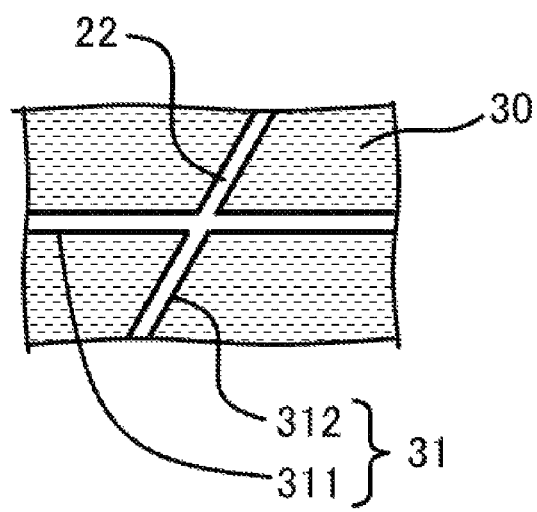
FIG. 14A is a plan view illustrating part of a nitrogen polar surface side of a GaN seed after arrangement of a pattern mask in which linear openings form a continuous intersection.

FIG. 14A is a plan view illustrating part of the nitrogen polar surface side of a GaN seed on which a pattern mask having linear openings forming intersections is arranged. The pattern mask 30 is provided with the first linear opening 311 and the second linear opening 312 whose longitudinal directions differ from each other, and a continuous intersection is formed by the two kinds of linear openings.

Figure 14B:
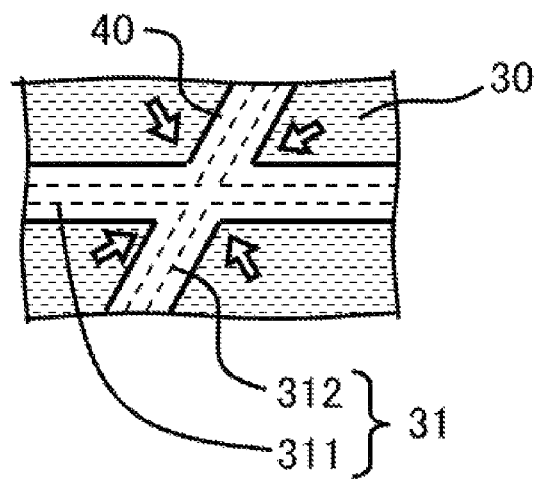
FIG. 14B is a plan view illustrating a GaN crystal grown through the pattern mask illustrated in FIG. 14A and in an early growth stage.

FIG. 14B illustrates a state where the GaN crystal 40 at the growth stage in FIG. 13C is formed on the GaN seed illustrated in FIG. 14A. The GaN crystal 40 has grown along the linear openings 31. The broken lines indicate the profiles of the linear openings 31 hidden below the GaN crystal 40.

The four arrows in FIG. 14B each point to a re-entrant portion formed on the side of the GaN crystal 40 growing over the intersection formed by the linear openings 311 and 312. The directions of the arrows represent re-entrant directions of the re-entrant portions.

Formation of such re-entrant portions produces the re-entrant angle effect, which promote the growth of the GaN crystal 40 in the directions opposite to the arrows. In other words, the re-entrant angle effect produces driving force for a GaN crystal to grow in such a manner to cause through-holes created above non-opening parts of the pattern mask to close.

The same mechanism occurs when the linear openings form a discontinuous intersection rather than a continuous intersection. This will be described referring to FIGS. 15A and 15B.

Figure 15A:
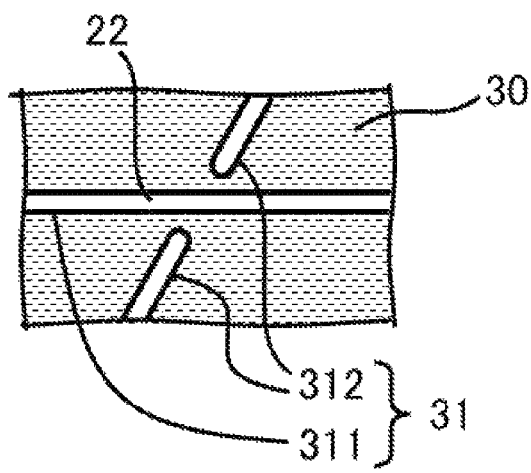
FIG. 15A is a plan view illustrating part of a nitrogen polar surface side of a GaN seed after arrangement of a pattern mask in which linear openings form a discontinuous intersection.

FIG. 15A is a plan view illustrating part of the nitrogen polar surface side of a GaN seed on which a pattern mask having linear openings forming a discontinuous intersection is arranged. The discontinuous intersection is formed by the first linear opening 311 and the second linear opening 312 which is divided into two.

Figure 15B:
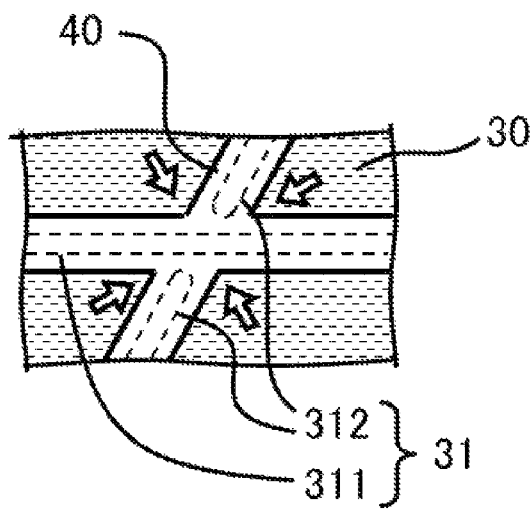
FIG. 15B is a plan view illustrating a GaN crystal grown through the pattern mask illustrated in FIG. 15A and in an early growth stage.

When a GaN crystal is grown on this GaN seed, since the distance between the first linear opening 311 and the second linear opening 312 is small at the discontinuous intersection, the GaN crystal at the growth stage in FIG. 13C has the same shape as when grown over a continuous intersection. Specifically, as illustrated in FIG. 15B, the GaN crystal 40 growing over the discontinuous intersection has sides on which re-entrant portions indicated by the arrows are formed. The resultant re-entrant angle effect promotes the growth of the GaN crystal 40 in the directions opposite to the arrows.

A person skilled in the art would be able to understand that the above-described re-entrant angle effect can be produced when a GaN crystal is grown on the various intersections illustrated in FIGS. 11A to 12F.

Figure 16:
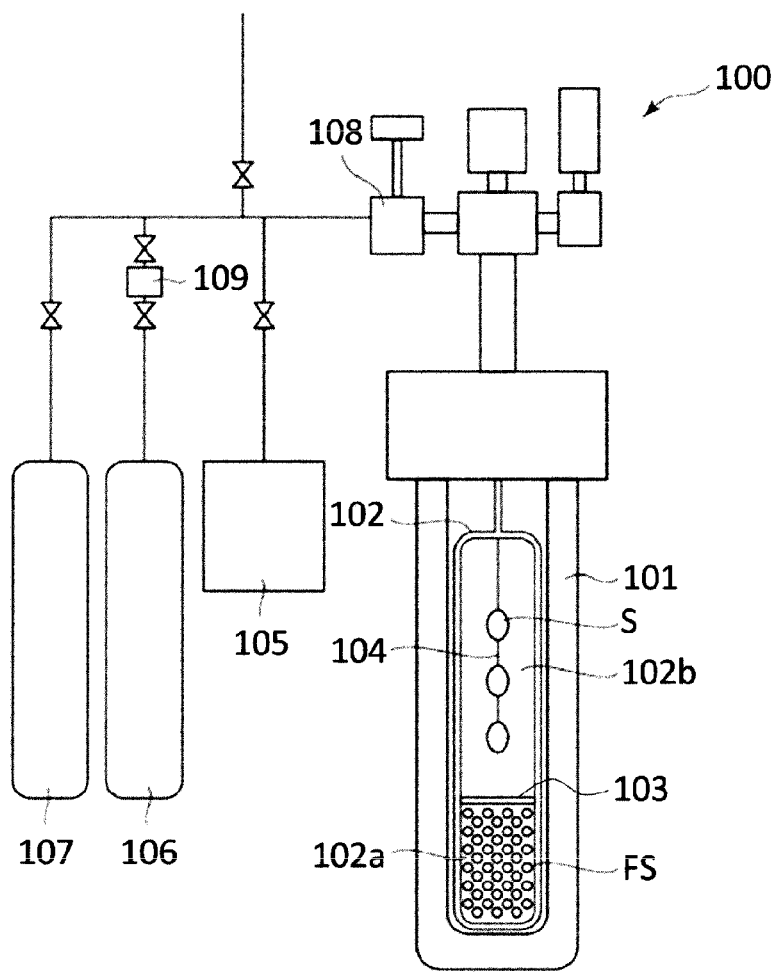
FIG. 16 illustrates a crystal growth apparatus which may be used for growing a GaN crystal by an ammonothermal method.

A crystal growth apparatus of the type illustrated in FIG. 16 may be preferably used for growing a GaN crystal by an ammonothermal method in the step S3.

Referring to FIG. 16, the crystal growth apparatus 100 is provided with an autoclave 101 and a capsule 102 which is placed in the autoclave and made of platinum.

The capsule 102 has therein a feedstock dissolution zone 102a and a crystal growth zone 102b which are partitioned from each other with a baffle 103 made of platinum. A feedstock FS is placed in the feedstock dissolution zone 102a. In the crystal growth zone 102b, a seed S is placed, hung by a Pt wire 104.

A gas line to which a vacuum pump 105, an ammonia cylinder 106, and a nitrogen cylinder 107 are connected is connected to the autoclave 101 and the capsule 102 via a valve 108. When $NH_3$ (ammonia) is introduced into the capsule 102, an amount of $NH_3$ supplied from the ammonia cylinder 106 is checkable with a mass flow meter 109.

As a feedstock, polycrystalline GaN produced by a method of reacting $NH_3$ gas with gaseous GaCl obtained by bringing a Ga simple substance (metallic gallium) into contact with HCl (hydrogen chloride) gas under heating, may be preferably used.

As a mineralizer to promote dissolution of the feedstock, one or more ammonium halides selected from $NH_4Cl$ (ammonium chloride), $NH_4Br$ (ammonium bromide), and $NH_4I$ (ammonium iodide) are preferably used in combination with $NH_4F$ (ammonium fluoride). Particularly preferably, $NH_4F$ and $NH_4I$ are used in combination.

When a growth temperature of 650° C. or less is used, it is not recommended to use ammonium halides other than $NH_4F$, singly as a mineralizer, because that will cause a GaN crystal to grow substantially only in the [000-1] direction, and no growth will occur in the lateral direction.

On the other hand, when $NH_4F$ is used singly as a mineralizer, the growth in the lateral direction is strongly promoted. When the growth in the lateral direction is promoted too much, it becomes difficult to grow a GaN crystal in the form illustrated in FIGS. 13A to 13E, that is, to grow a GaN crystal such that gaps are formed between the GaN crystal and a pattern mask.

When the GaN crystal is grown on the seed S, $NH_3$ is introduced also in a space between the autoclave 101 and the capsule 102, and a supercritical or subcritical state is created inside the capsule 102 by heating it from the outside of the autoclave 101 with a heater (not illustrated).

Etching occurs also on the surface of the seed S until the feedstock FS sufficiently dissolves and a solvent reaches saturation. If necessary, with a view to prompting etchback of the seed S before the growth starts, a temperature inversion period in which the temperature gradient between the feedstock dissolution zone 102a and the crystal growth zone 102b is the inverse of that during crystal growth, may be provided.

The growth temperature is preferably 550° C. or higher. Although use of a growth temperature of 1000° C. or more is not precluded, a GaN crystal of a sufficiently high quality can be grown even at a temperate of 700° C. or less.

The growth pressure may be set for example within a range of 100 to 250 MPa, but is not limited thereto.

In one example, GaN may be grown under the following conditions: $NH_4F$ and $NH_4I$ used as mineralizers are 0.5% and 4.0%, respectively, in terms of molar ratio to $NH_3$; the pressure is about 220 MPa; the average value of a temperature Ts in the feedstock dissolution zone and a temperature Tg in the crystal growth zone is about 600° C.; and the temperature difference Ts–Tg between these two zones is about 5° C. (Ts>Tg).

Although it is possible to raise the growth rate of a GaN crystal by increasing the temperature difference between the feedstock dissolution zone and the crystal growth zone, a too high growth rate can cause a problem that the growth of the GaN crystal has difficulty in proceeding from the stage in FIG. 13C to the stage in FIG. 13D, in other words, the through-holes in the GaN crystal have difficulty in closing.

In the Step S3, the capsule may be replaced whenever the feedstock is exhausted, to repeat regrowth of the GaN crystal.

The GaN crystal grown in the step S3 may be sliced parallel to or substantially parallel to the C-plane to produce a C-plane GaN substrate.

Figure 17A:
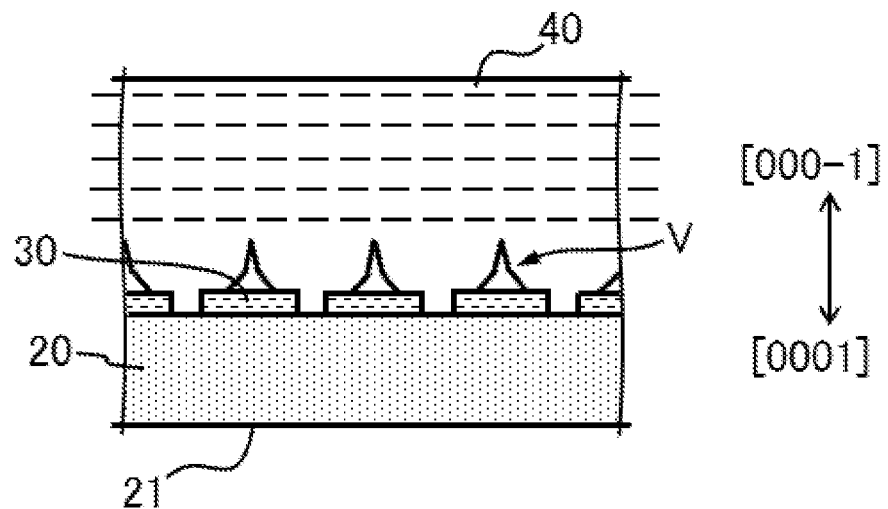
FIGS. 17A and 17B are cross sectional views each illustrating positions at which a GaN crystal is sliced.

For example, slicing the GaN crystal 40 at positions indicated by the broken lines in FIG. 17A provides a C-plane GaN substrate which has no through-hole and is hence preferably usable as a substrate for semiconductor devices. In addition, thus obtained substrate may be used as a seed in growing a bulk GaN crystal or may be used for production of a GaN layer-bonded substrate.

Figure 17B:
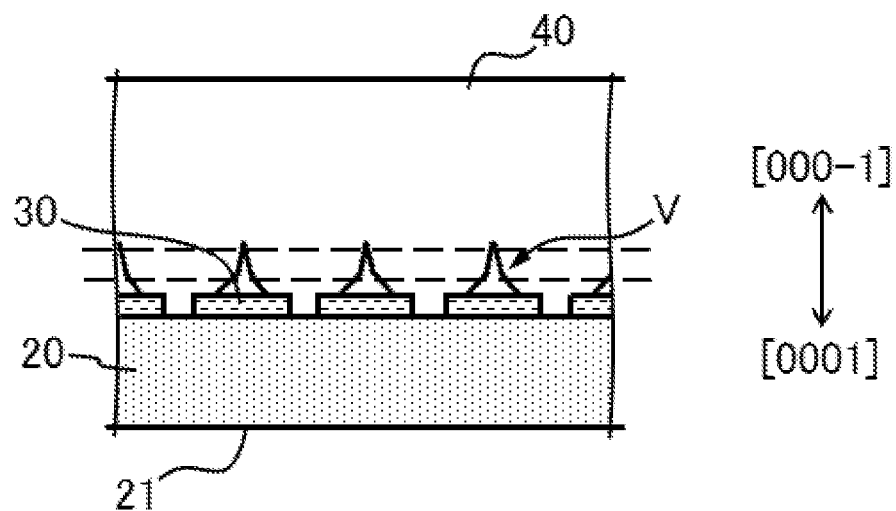

In contrast, slicing the GaN crystal 40 at positions indicated by the broken lines in FIG. 17B provides a C-plane GaN substrate which has through-holes and is hence unsuitable for use as a substrate for semiconductor devices. Thus obtained substrate is however usable as a seed in ammonothermally growing a bulk GaN crystal using an acidic mineralizer containing F (fluorine), because when an acidic mineralizer contains F, even if a seed has a through-hole, a GaN crystal grows in a manner to close the through hole. Preferred examples of acidic mineralizers containing F include $GaF_3$ (gallium fluoride), in addition to $NH_4F$ mentioned above.

In one example, in the step S3, the growth of the GaN crystal 40 may be terminated while all or part of the through-holes T remain unclosed; however, in such a case, regardless of at which position the grown GaN crystal 40 is sliced, only a C-plane GaN substrate having through-holes is obtainable. Such a C-plane GaN substrate having through-holes is usable as a seed in ammonothermally growing a bulk GaN crystal using an acidic mineralizer containing F.

2.2. Production Method of Conductive C-Plane GaN Substrate

Examples of methods for producing the conductive C-plane GaN substrate according to the embodiment are given below.

(1) First Production Method

A first production method comprises the following two steps S11 and S12.

S11: growing a bulk GaN crystal having an O (oxygen) concentration of $2 \times 10^{18}$ atoms/cm$^3$ or more using the GaN crystal growth method described in the section 2.1.

S12: processing the bulk GaN crystal grown in the step S11 to obtain a target conductive C-plane GaN substrate.

To achieve doping with O of the GaN crystal grown by the growth method described in the section 2.1, in the step S3 of the growth method, O in the form of moisture may be introduced into a growth vessel (in the example in FIG. 16, the capsule 102) or the polycrystalline GaN used as the feedstock may be doped with O. It is also possible to use both procedures in combination.

When large part of O introduced into the growth vessel is in the form of moisture, reducing the mineralizer concentration may be effective in increasing the concentration of O in the GaN crystal precipitated on the seed. The reason is that since the dissolved amount of GaN depends on the mineralizer concentration, when the mineralizer concentration is lowered to decrease the dissolved amount of GaN, the concentration ratio of O to GaN increases in the solvent.

According to the present inventors' findings from experiments, the n-type carrier concentration of the O-doped GaN crystal grown by the method described in the section 2.1. is from 20 to 70% of the O concentration and often less than 30%. Accordingly, in order to produce a C-plane GaN substrate having an n-type carrier concentration of $1 \times 10^{18}$ cm$^{-3}$ or more by the first production method, it is desirable to grow a bulk GaN crystal having an O concentration of at least $2 \times 10^{18}$ atoms/cm$^3$, preferably $4 \times 10^{18}$ atoms/cm$^3$, by the method described in the section 2.1.

The entirety of the GaN crystal grown by the method described in the section 2.1. may be doped with O at a concentration of $2 \times 10^{18}$ atoms/cm$^3$ or more.

In one example, in the GaN crystal grown by the method described in the section 2.1., only the portion to be processed into conductive C-plane GaN substrates in the step S12 may be doped with O at a concentration of $2 \times 10^{18}$ atoms/cm$^3$ or more. For example, a GaN crystal is grown without any intentional introduction of O into the growth vessel until the step in FIG. 13D, then the growth vessel is replaced, and GaN is regrown with intentional introduction of O into the growth vessel in the stage in FIG. 13E.

In the step S12, by slicing the bulk GaN crystal grown in the step S11 at positions indicated by the broken lines in FIG. 17A, conductive C-plane GaN substrates without any through hole are obtained.

The bulk GaN crystal may be sliced using a wire saw, for example. Planarization of a cut face may be carried out by any one or both of grinding and lapping. Removal of a damaged layer from the cut face may be carried out by any one or both of CMP and etching.

(2) Second Production Method

A second production method comprises the following four steps S21 to S24.

S21: growing a bulk GaN crystal using the GaN crystal growth method described in the section 2.1.

S22: processing the bulk GaN crystal grown in the step S21 to obtain a C-plane GaN substrate.

S23: ammonothermally growing a bulk GaN crystal having an O concentration of $2 \times 10^{18}$ atoms/cm$^3$ or more on the nitrogen polar surface of the C-plane GaN substrate obtained in the step S22.

S24: processing the bulk GaN crystal grown in the step S23 to obtain a target conductive C-plane GaN substrate.

The bulk GaN crystal grown in the step S21 need not to be intentionally doped with O, but is not limited thereto.

In the step S22, the bulk GaN crystal grown in the step S21 may be sliced either at the positions illustrated in FIG. 17A or at the positions illustrated in FIG. 17B. Although slicing at the positions illustrated in FIG. 17B provides a C-plane GaN substrate having through-holes, in the subsequent step S23, an acidic mineralizer containing F may be used to thereby grow a GaN crystal in a manner to close the through-holes.

The bulk GaN crystal may be sliced using, for example, a wire saw. Planarization of a cut face may be carried out by any one or both of grinding and lapping. Removal of a damaged layer from the cut face may be carried out by any one or both of CMP and etching.

The step S23 is described as follows.

In the step S23, a GaN crystal is ammonothermally grown in a growth vessel into which a sufficient amount of O has been introduced. As a seed, the C-plane GaN substrate obtained in the step S22 may be used as it is, without arranging any pattern mask or the like on the main surfaces.

A growth apparatus of the type illustrated in FIG. 16 may be preferably used.

As a feedstock, polycrystalline GaN produced by a method of reacting $NH_3$ gas with gaseous GaCl obtained by bringing a Ga simple substance into contact with HCl gas under heating, may be preferably used.

As a mineralizer, an acidic mineralizer containing F, such as $NH_4F$, is used. One or more ammonium halides selected from $NH_4Cl$, $NH_4Br$, and $NH_4I$ may be used in combination with $NH_4F$, and it is particularly preferable to use $NH_4F$ and $NH_4I$ in combination.

Preferably, the concentration of $NH_4F$ is from 0.1 to 1% in terms of molar ratio to $NH_3$. Preferably, the concentrations of ammonium halides other than $NH_4F$ are from 1 to 5% in terms of molar ratio to $NH_3$.

The pressure and the temperature may be set for example within a range of 100 to 250 MPa and within a range of 550 to 650° C., respectively, but are not limited thereto.

As confirmed by the present inventors, under the same acidic ammonothermal conditions, GaN crystals with different impurity concentrations grow on the nitrogen polar surface and the gallium polar surface of a C-plane GaN substrate. In an experiment carried out by the present inventors, a GaN crystal grown on the nitrogen polar surface had an O concentration of $1.2\times10^{19}$ cm$^{-3}$ and an H concentration of $1.5\times10^{19}$ cm$^{-3}$, whereas a GaN crystal grown on the gallium polar surface under the same conditions had an O concentration of $3\times10^{17}$ cm$^{-3}$ and an H concentration of $2\times10^{19}$ cm$^{-3}$.

In one example, for the growth of the bulk GaN crystal in the step S23, the method described in the section 2.1. may be used. In this case, it is desirable that there is no through-hole in the C-plane GaN substrate produced in the step S22 and used as a seed.

In the step S24, the bulk GaN crystal grown in the step S23 is sliced using, for example, a wire saw. Planarization of a cut face of the GaN crystal may be carried out by any one or both of grinding and lapping. Removal of a damaged layer from the cut face may be carried out by any one or both of CMP and etching.

Although the first production method and the second production method have been described above, methods for producing the conductive C-plane GaN substrate according to the embodiment are not limited to these two methods.

3. EXPERIMENTAL RESULTS

3.1. Experiment 1

(1) Production of Conductive C-Plane GaN Substrate

As a primary GaN seed, a C-plane GaN substrate cut out from a GaN crystal grown by an HVPE method was prepared. The C-plane GaN substrate had a gallium polar surface and a nitrogen polar surface, both of which were CMP-finished. The nitrogen polar surface had an orientation of within 1° from [000-1].

A pattern mask was formed on the nitrogen polar surface of the C-plane GaN substrate by a lift-off method, which pattern mask was a laminated film composed of a 100 nm thick TiW layer and a 100 nm thick Pt layer laminated on the TiW layer. The pattern mask was provided with a stripe pattern formed of linear openings. The linear openings each had a line width of 50 μm, and the pitch between the linear openings was 4 mm. The stripe direction was tilted by 12° from the intersection line between the M-plane and the nitrogen polar surface in the primary GaN seed.

After formation of the pattern mask, a GaN crystal was grown on the primary GaN seed by an acidic ammonothermal method using a crystal growth apparatus of the type illustrated in FIG. 16.

Used as a feedstock was polycrystalline GaN synthesized by a method of reacting $NH_3$ gas with gaseous GaCl obtained by bringing a Ga simple substance into contact with HCl gas under heating.

$NH_4F$ and $NH_4I$ were used in combination as mineralizers. The amounts of $NH_4F$ and $NH_4I$ were 0.5% and 4.0%, respectively, in terms of molar ratio to $NH_3$. $NH_4I$ was synthesized by introducing HI (hydrogen iodide) into the capsule made of Pt after introducing $NH_3$.

By using $NH_4F$ which had absorbed moisture, at least about 100 ppm of O in terms of weight ratio to ammonia was introduced into the capsule.

Growth conditions were as follows: the average value of the temperature Tg in the crystal growth zone and the temperature Ts in the feedstock dissolution zone was 598° C.; the temperature difference between the crystal growth zone and the feedstock dissolution zone was 5° C. (Ts>Tg); and the pressure was 220 MPa.

After 35 days from the beginning of growth, the capsule was opened, and the GaN seed was taken out for observation of a GaN crystal grown on the [000-1] side thereof, which revealed that the growth front reached above the pattern mask. However, the growth rate in the lateral direction was not uniform on the surface, and only some of through-holes above non-opening parts of the pattern mask were closed, while most of the through-holes had not yet closed.

After the observation, the GaN seed was transferred into a newly prepared capsule, and regrowth was performed under the same ammonothermal growth conditions. After 35 days from the beginning of the regrowth, the growth was terminated.

During the regrowth, the through-holes of the GaN crystal completely closed and the growth front was flattened.

The observation of the surface on the [0001] side (the side having bonded to the GaN seed) of the grown GaN crystal separated from the GaN seed revealed that a plurality of V-grooves parallel to each other were formed at regular intervals.

The longitudinal direction of the V-grooves was the same as the longitudinal directions of the linear openings provided in the pattern mask, and the pitch between the V-grooves was the same as the pitch between the linear openings. This means that the GaN crystal grew in the form illustrated in FIGS. 13A to 13E and that the traces of the resultant voids were the V-grooves.

The depth of the V-grooves measured with a laser microscope was 1.9 mm at the deepest part. This observation result, combined with that before the regrowth, suggested that the through-holes created in the GaN crystal during its growth began to close when the GaN crystal grew by from 1 to 2 mm in the [000-1] direction.

The ammonothermally grown GaN crystal was processed to make a C-plane GaN substrate having a thickness of about 330 μm. Specifically, the GaN crystal was sliced parallel to the C-plane with a multi-wire saw, and both main surfaces of a resultant blank substrate were planarized by grinding and subsequently CMP-finished for removing a damaged layer.

On the gallium polar surface side of the C-plane GaN substrate, an O concentration was measured by SIMS within a range of from the surface to a depth of 10 μm, which revealed that the O concentration in a part with a depth of 1 μm or more was $1\times10^{18}$ atoms/cm$^3$.

Next, the C-plane GaN substrate was used as a secondary GaN seed to grow a GaN crystal by an acidic ammonothermal method.

A growth apparatus of the type illustrated in FIG. 16 was used.

Used as a feedstock was polycrystalline GaN synthesized by a method of reacting $NH_3$ gas with gaseous GaCl obtained by bringing a Ga simple substance into contact with HCl gas under heating.

$NH_4F$ and $NH_4I$ were used as mineralizers. The amounts of $NH_4F$ and $NH_4I$ were each 1.0% in terms of molar ratio to $NH_3$. $NH_4I$ was synthesized by introducing HI into the capsule made of Pt after introducing $NH_3$.

By using $NH_4F$ which had absorbed moisture, at least about 370 ppm of O in terms of weight ratio to ammonia was introduced into the capsule.

Growth conditions were as follows: the average value of the temperature Tg in the crystal growth zone and the temperature Ts in the feedstock dissolution zone was from 605 to 610° C.; the temperature difference between the crystal growth zone and the feedstock dissolution zone was from 5 to 10° C. (Ts>Tg); and the pressure was 220 MPa.

As a result of growth for 28 days, on the nitrogen polar surface of the secondary GaN seed, the GaN crystal was grown by 1.8 mm in the [000-1] direction.

Next, the grown GaN crystal was processed to make a conductive C-plane GaN substrate having a diameter of 50 mm. Both main surfaces of the GaN substrate were planarized by grinding and subsequently CMP-finished for removing a damaged layer. The final substrate thickness was 350 μm.

(2) Evaluation of Conductive C-Plane GaN Substrate
(i) Electrical Properties

The conductive C-plane GaN substrate made in (1) above was cut to make a plate specimen having a thickness of 350 μm and a main surface of a 1×1 $cm^2$ square. Lead wires were bonded to the four corners of the specimen using indium solder, and the Hall effect measurement by the van der Pauw method was performed. The measurement confirmed that the carrier was n-type. Based on the measurement, the carrier concentration at room temperature was determined to be $2 \times 10^{18}$ $cm^{-3}$.

From the n-type carrier concentration and a separately measured resistivity of the specimen at room temperature, which was $1.7 \times 10^{-2}$ Ω·cm, the Hall mobility was determined to be 178 $cm^2/V \cdot s$.

(ii) XRC of (004) Reflection

XRCs of the (004) reflection on the gallium polar surface of the conductive C-plane GaN substrate made in (1) above were measured with an X-ray diffractometer [PANalytical X'Pert Pro MRD from Spectris Co., Ltd.] using CuKα as an X-radiation source. Used as incident optics were a ½ slit, an X-ray mirror, a Ge (440) 4-crystal monochromator, and a cross slit of w 0.2 mm×h 1 mm. Used as a receiving optics was the OD mode of a semiconductor pixel detector, PIXcel$^{3D}$®. The optics had a resolution of from 5 to 6 arcsec.

The beam size of X-rays on the sample surface was set so as to be 0.2 mm×5 mm when the incident angle of X-rays was 90° (the incident direction of X-rays was orthogonal to the sample surface). At the time of measurement, the direction in which the beam size was 5 mm was kept orthogonal to the plane of incidence of X-rays.

First, ω scans were performed at 1 mm intervals on a 48-mm-long line segment which was parallel to the m-axis and passed through an approximate center of the gallium polar surface. In each of the ω scans, the plane of incidence of X-rays was kept parallel to the m-axis. In other words, X-rays were made incident on the gallium polar surface of the sample from a direction orthogonal to the a-axis.

The peak angles and FWHMs of the XRCs of the (004) reflection at all measurement points were as shown in Table 1 below.

[Table 1]

TABLE 1

| Measurement Point No. | Peak Angle (degree) | FWHM (arcsec) |
|---|---|---|
| 1 | 36.481 | 17.31 |
| 2 | 36.481 | 17.48 |
| 3 | 36.479 | 16.33 |
| 4 | 36.474 | 10.11 |
| 5 | 36.473 | 8.11 |
| 6 | 36.472 | 9.57 |
| 7 | 36.468 | 10.59 |
| 8 | 36.466 | 10.43 |
| 9 | 36.463 | 8.45 |
| 10 | 36.462 | 9.07 |
| 11 | 36.459 | 9.13 |
| 12 | 36.458 | 8.61 |
| 13 | 36.456 | 8.78 |
| 14 | 36.455 | 7.89 |
| 15 | 36.452 | 8.37 |
| 16 | 36.451 | 8.82 |
| 17 | 36.449 | 8.99 |
| 18 | 36.448 | 7.82 |
| 19 | 36.447 | 7.54 |
| 20 | 36.446 | 8.47 |
| 21 | 36.444 | 8.41 |
| 22 | 36.445 | 10.94 |
| 23 | 36.441 | 12.15 |
| 24 | 36.440 | 12.58 |
| 25 | 36.434 | 12.45 |
| 26 | 36.432 | 10.31 |
| 27 | 36.430 | 7.90 |
| 28 | 36.429 | 7.91 |
| 29 | 36.426 | 8.91 |
| 30 | 36.426 | 9.46 |
| 31 | 36.423 | 9.25 |
| 32 | 36.423 | 9.50 |
| 33 | 36.419 | 9.96 |
| 34 | 36.419 | 7.84 |
| 35 | 36.417 | 10.36 |
| 36 | 36.415 | 10.11 |
| 37 | 36.413 | 10.64 |
| 38 | 36.412 | 9.75 |
| 39 | 36.409 | 9.48 |
| 40 | 36.408 | 7.45 |
| 41 | 36.407 | 10.92 |
| 42 | 36.405 | 11.14 |
| 43 | 36.401 | 12.04 |
| 44 | 36.399 | 11.72 |
| 45 | 36.400 | 13.46 |
| 46 | 36.397 | 11.27 |
| 47 | 36.401 | 10.31 |
| 48 | 36.397 | 10.22 |

The maximum value, average value and standard deviation of the FWHMs across all the measurement points were 17.5 arcsec, 10.2 arcsec and 2.3 arcsec, respectively.

The difference between the maximum and minimum values of the peak angles across all the measurement points was 0.08°.

Looking to a 40-mm-long section which includes 40 measurement points from measurement point No. 5 through measurement point No. 44, the maximum value, average value, and standard deviation of the FWHMs were 12.6 arcsec, 9.6 arcsec, and 1.4 arcsec, respectively, and the difference between the maximum and minimum values of the peak angles was 0.07°.

Next, ω scans were performed at 1 mm intervals on a 49-mm-long line segment which was parallel to the a-axis and passed through an approximate center of the gallium polar surface.

In each of the ω scans, the plane of incidence of X-rays was kept parallel to the a-axis. In other words, X-rays were made incident on the gallium polar surface of the sample from a direction orthogonal to the m-axis.

The peak angles and FWHMs of the XRCs of the (004) reflection at all measurement points were as shown in Table 2 below.

[Table 2]

TABLE 2

| Measurement Point No. | Peak Angle (degree) | FWHM (arcsec) |
|---|---|---|
| 1 | 36.560 | 9.24 |
| 2 | 36.557 | 10.83 |
| 3 | 36.555 | 9.41 |
| 4 | 36.554 | 11.52 |
| 5 | 36.554 | 13.93 |
| 6 | 36.548 | 18.17 |
| 7 | 36.544 | 13.09 |
| 8 | 36.542 | 9.01 |
| 9 | 36.541 | 7.75 |
| 10 | 36.539 | 7.70 |
| 11 | 36.539 | 7.55 |
| 12 | 36.537 | 9.37 |
| 13 | 36.536 | 7.03 |
| 14 | 36.535 | 7.57 |
| 15 | 36.534 | 9.19 |
| 16 | 36.532 | 12.40 |
| 17 | 36.531 | 11.62 |
| 18 | 36.530 | 11.29 |
| 19 | 36.529 | 10.00 |
| 20 | 36.528 | 8.12 |
| 21 | 36.527 | 7.82 |
| 22 | 36.526 | 7.74 |
| 23 | 36.526 | 8.89 |
| 24 | 36.525 | 15.33 |
| 25 | 36.520 | 17.26 |
| 26 | 36.517 | 9.37 |
| 27 | 36.517 | 7.84 |
| 28 | 36.516 | 7.08 |
| 29 | 36.515 | 8.61 |
| 30 | 36.513 | 8.72 |
| 31 | 36.512 | 8.12 |
| 32 | 36.511 | 7.98 |
| 33 | 36.510 | 8.15 |
| 34 | 36.508 | 7.64 |
| 35 | 36.507 | 7.07 |
| 36 | 36.505 | 7.83 |
| 37 | 36.503 | 7.09 |
| 38 | 36.503 | 7.47 |
| 39 | 36.501 | 8.81 |
| 40 | 36.499 | 9.40 |
| 41 | 36.498 | 9.31 |
| 42 | 36.497 | 9.90 |
| 43 | 36.496 | 9.65 |
| 44 | 36.495 | 8.91 |
| 45 | 36.494 | 9.38 |
| 46 | 36.492 | 8.15 |
| 47 | 36.492 | 8.11 |
| 48 | 36.491 | 7.45 |
| 49 | 36.490 | 9.36 |

The maximum value, average value and standard deviation of the FWHMs across all the measurement points were 18.2 arcsec, 9.5 arcsec and 2.5 arcsec, respectively.

The difference between the maximum and minimum values of the peak angles across all the measurement points was 0.07°.

Looking to a 40-mm-long section which includes 40 measurement points from measurement point No. 5 through measurement point No. 44, the maximum value, average value, and standard deviation of the FWHMs were 18.2 arcsec, 9.5 arcsec, and 2.7 arcsec, respectively, and the difference between the maximum and minimum values of the peak angles was 0.06°.

(iii) Impurity Concentration

On the gallium polar surface side of the conductive C-plane GaN substrate made in (1) above, concentrations of F (fluorine), I (iodine), O (oxygen), and H (hydrogen) within a range of from the surface to a depth of 10 μm were measured by SIMS. The concentrations in a part with a depth of 1 μm or more were as follows: $4 \times 10^{15}$ atoms/cm$^3$ for F; $4 \times 10^{15}$ atoms/cm$^3$ for I; $7 \times 10^{18}$ atoms/cm$^3$ for O; and $9 \times 10^{18}$ atoms/cm$^3$ for H.

(iv) Infrared Absorption Spectrum

An infrared absorption spectrum of the conductive C-plane GaN substrate made in (1) above was measured, and a plurality of absorption peaks attributable to a gallium vacancy-hydrogen complex were observed within a range of 3140 to 3200 cm$^{-1}$.

3.2. Experiment 2

(1) Production of Conductive C-Plane GaN Substrate

As a primary GaN seed, a C-plane GaN substrate cut out from a GaN crystal grown by an HVPE method was prepared. The C-plane GaN substrate had a gallium polar surface and a nitrogen polar surface, both of which were CMP-finished. The nitrogen polar surface had an orientation of within 1° from [000-1].

A pattern mask was formed on the nitrogen polar surface of the primary GaN seed by a lift-off method, which mask was a laminated film composed of a 100 nm thick TiW layer and a 100 nm thick Pt layer laminated on the TiW layer. The pattern mask was provided with a slanted rectangular grid pattern formed of linear openings.

The slanted rectangular grid pattern was formed by a first linear opening and a second linear opening forming an angle of 60° with each other. The linear openings each had a line width of 50 μm. The pitch between the first linear openings was 4 mm, and the pitch between the second linear openings was 2 mm.

The longitudinal directions of the first and second linear openings were each tilted by 12° from the intersection line between the M-plane and the nitrogen polar surface in the primary GaN seed.

After formation of the pattern mask, a GaN crystal was grown on the primary GaN seed by an acidic ammonothermal method using a crystal growth apparatus of the type illustrated in FIG. 16.

Used as a feedstock was polycrystalline GaN synthesized by a method of reacting NH$_3$ gas with gaseous GaCl obtained by bringing a Ga simple substance into contact with HCl gas under heating.

NH$_4$F and NH$_4$I were used in combination as mineralizers. The amounts of NH$_4$F and NH$_4$I were 0.5% and 4.0%, respectively, in terms of molar ratio to NH$_3$. NH$_4$I was synthesized by introducing HI (hydrogen iodide) into the capsule made of Pt after introducing NH$_3$.

Growth conditions were as follows: the average value of the temperature Tg in the crystal growth zone and the temperature Ts in the feedstock dissolution zone was from 605 to 610° C.; the temperature difference between the crystal growth zone and the feedstock dissolution zone was from 3 to 8° C. (Ts>Tg); and the pressure was 220 MPa.

As a result of growth for 22 days, on the nitrogen polar surface of the primary GaN seed, the GaN crystal was grown by 3.2 mm in the [000-1] direction.

The ammonothermally grown GaN crystal was processed to make a C-plane GaN substrate having a thickness of about 430 μm. Specifically, the GaN crystal was sliced parallel to the C-plane with a multi-wire saw, and both main surfaces of a resultant blank substrate were planarized by grinding and subsequently CMP-finished for removing a damaged layer.

Next, on the nitrogen polar surface of the C-plane GaN substrate, the same pattern mask as the pattern mask provided on the primary GaN seed was formed by a lift-off method. The orientation of the slanted rectangular grid pattern provided on the pattern mask was the same as that of the pattern mask provided on the primary GaN seed.

After forming the pattern mask, the C-plane GaN substrate was used as a secondary GaN seed to grow a GaN crystal by an acidic ammonothermal method.

A growth apparatus of the type illustrated in FIG. 16 was used.

Used as a feedstock was polycrystalline GaN synthesized by a method of reacting $NH_3$ gas with gaseous GaCl obtained by bringing a Ga simple substance into contact with HCl gas under heating.

$NH_4F$ and $NH_4I$ were used in combination as mineralizers. The amounts of $NH_4F$ and $NH_4I$ were each 1.0% in terms of molar ratio to $NH_3$. $NH_4I$ was synthesized by introducing HI (hydrogen iodide) into the capsule made of Pt after introducing $NH_3$.

By using $NH_4F$ which had absorbed moisture, at least about 365 ppm of O in terms of weight ratio to ammonia was introduced into the capsule.

Growth conditions were as follows: the average value of the temperature Tg in the crystal growth zone and the temperature Ts in the feedstock dissolution zone was from 605 to 610° C.; the temperature difference between the crystal growth zone and the feedstock dissolution zone was from 5 to 10° C. (Ts>Tg); and the pressure was 220 MPa.

As a result of growth for 28 days, on the nitrogen polar surface of the secondary GaN seed, the GaN crystal was grown by 2.0 mm in the [000-1] direction.

Next, the grown GaN crystal was processed to make a conductive C-plane GaN substrate having a diameter of 50 mm. Both main surfaces of the GaN substrate were planarized by grinding and subsequently CMP-finished for removing a damaged layer. The final substrate thickness was 309 μm.

(2) Evaluation of Conductive C-Plane GaN Substrate (i) Electrical Properties

In the same manner as in Experiment 1 above, a specimen was made from the conductive C-plane GaN substrate made in (1) above, and the Hall effect measurement by the van der Pauw method was performed. The measurement confirmed that the carrier was n-type. Based on the measurement, the carrier concentration at room temperature was determined to be $8 \times 10^{18}$ $cm^{-3}$.

From the n-type carrier concentration and a separately measured resistivity of the specimen at room temperature, which was $6.1 \times 10^{-3}$ Ω·cm, the Hall mobility was determined to be 135 $cm^2/V·s$.

(ii) XRC of (004) Reflection

XRCs of the (004) reflection on the gallium polar surface of the conductive C-plane GaN substrate made in (1) above were measured in the same manner as in Experiment 1 above.

First, ω scans were performed at 1 mm intervals on a 47-mm-long line segment which was parallel to the m-axis and passed through an approximate center of the gallium polar surface. In each of the ω scans, the plane of incidence of X-rays was kept parallel to the m-axis. In other words, X-rays were made incident on the gallium polar surface of the sample from a direction orthogonal to the a-axis.

The peak angles and FWHMs of the XRCs of the (004) reflection at all measurement points were as shown in Table 3 below.

[Table 3]

TABLE 3

| Measurement Point No. | Peak Angle (degree) | FWHM (arcsec) |
|---|---|---|
| 1 | 36.436 | 14.89 |
| 2 | 36.436 | 12.69 |
| 3 | 36.437 | 10.68 |
| 4 | 36.435 | 7.88 |
| 5 | 36.436 | 9.63 |
| 6 | 36.433 | 9.44 |
| 7 | 36.432 | 9.92 |
| 8 | 36.432 | 13.45 |
| 9 | 36.430 | 12.89 |
| 10 | 36.429 | 9.34 |
| 11 | 36.426 | 10.17 |
| 12 | 36.424 | 9.50 |
| 13 | 36.420 | 10.67 |
| 14 | 36.418 | 16.13 |
| 15 | 36.414 | 18.15 |
| 16 | 36.410 | 19.70 |
| 17 | 36.408 | 9.21 |
| 18 | 36.407 | 10.28 |
| 19 | 36.403 | 9.47 |
| 20 | 36.400 | 8.87 |
| 21 | 36.396 | 9.58 |
| 22 | 36.392 | 9.57 |
| 23 | 36.389 | 10.35 |
| 24 | 36.386 | 12.61 |
| 25 | 36.381 | 8.30 |
| 26 | 36.380 | 9.60 |
| 27 | 36.375 | 8.64 |
| 28 | 36.374 | 9.54 |
| 29 | 36.369 | 8.52 |
| 30 | 36.370 | 9.13 |
| 31 | 36.364 | 8.11 |
| 32 | 36.367 | 11.78 |
| 33 | 36.362 | 14.32 |
| 34 | 36.364 | 12.32 |
| 35 | 36.354 | 14.02 |
| 36 | 36.354 | 11.84 |
| 37 | 36.346 | 12.02 |
| 38 | 36.353 | 18.81 |
| 39 | 36.347 | 12.77 |
| 40 | 36.350 | 10.32 |
| 41 | 36.342 | 9.88 |
| 42 | 36.349 | 9.27 |
| 43 | 36.338 | 11.70 |
| 44 | 36.347 | 12.09 |
| 45 | 36.339 | 9.45 |
| 46 | 36.346 | 8.63 |
| 47 | 36.338 | 11.81 |
| — | — | — |

The maximum value, average value, and standard deviation of the FWHMs across all the measurement points were 19.7 arcsec, 11.2 arcsec, and 2.7 arcsec, respectively.

The difference between the maximum and minimum values of the peak angles across all the measurement points was 0.10°.

Looking to a 40-mm-long section which includes 40 measurement points from measurement point No. 4 through measurement point No. 43, the maximum value, average value, and standard deviation of the FWHMs were 19.7 arcsec, 11.2 arcsec, and 3.1 arcsec, respectively, and the difference between the maximum and minimum values of the peak angles was 0.10°.

Next, ω scans were performed at 1 mm intervals on a 46-mm-long line segment which was parallel to the a-axis and passed through an approximate center of the gallium polar surface. In each of the ω scans, the plane of incidence of X-rays was kept parallel to the a-axis. In other words, X-rays were made incident on the gallium polar surface of the sample from a direction orthogonal to the m-axis.

The peak angles and FWHMs of the XRCs of the (004) reflection at all measurement points were as shown in Table 4 below.

[Table 4]

TABLE 4

| Measurement Point No. | Peak Angle (degree) | FWHM (arcsec) |
|---|---|---|
| 1 | 36.513 | 12.83 |
| 2 | 36.505 | 10.72 |
| 3 | 36.508 | 12.24 |
| 4 | 36.506 | 9.09 |
| 5 | 36.504 | 10.78 |
| 6 | 36.501 | 9.92 |
| 7 | 36.502 | 12.03 |
| 8 | 36.501 | 9.72 |
| 9 | 36.499 | 11.65 |
| 10 | 36.495 | 13.77 |
| 11 | 36.493 | 10.28 |
| 12 | 36.489 | 12.05 |
| 13 | 36.491 | 8.70 |
| 14 | 36.489 | 9.85 |
| 15 | 36.487 | 8.50 |
| 16 | 36.484 | 8.40 |
| 17 | 36.481 | 10.79 |
| 18 | 36.479 | 8.13 |
| 19 | 36.476 | 9.76 |
| 20 | 36.473 | 9.73 |
| 21 | 36.470 | 11.41 |
| 22 | 36.466 | 11.62 |
| 23 | 36.464 | 9.94 |
| 24 | 36.460 | 9.34 |
| 25 | 36.455 | 18.80 |
| 26 | 36.453 | 9.94 |
| 27 | 36.451 | 8.50 |
| 28 | 36.449 | 8.20 |
| 29 | 36.446 | 11.23 |
| 30 | 36.443 | 9.16 |
| 31 | 36.440 | 11.15 |
| 32 | 36.437 | 10.42 |
| 33 | 36.434 | 12.29 |
| 34 | 36.435 | 12.19 |
| 35 | 36.431 | 11.12 |
| 36 | 36.428 | 12.62 |
| 37 | 36.423 | 16.14 |
| 38 | 36.422 | 8.83 |
| 39 | 36.416 | 11.23 |
| 40 | 36.416 | 11.24 |
| 41 | 36.414 | 8.52 |
| 42 | 36.412 | 8.87 |
| 43 | 36.410 | 10.01 |
| 44 | 36.409 | 7.72 |
| 45 | 36.408 | 8.32 |
| 46 | 36.406 | 8.67 |

The maximum value, average value, and standard deviation of the FWHMs across all the measurement points were 18.8 arcsec, 10.6 arcsec, and 2.1 arcsec, respectively.

The difference between the maximum and minimum values of the peak angles across all the measurement points was 0.11°.

Looking to a 40-mm-long section which includes 40 measurement points from measurement point No. 4 through measurement point No. 43, the maximum value, average value, and standard deviation of the FWHMs were 18.8 arcsec, 10.6 arcsec, and 2.1 arcsec, respectively, and the difference between the maximum and minimum values of the peak angles was 0.10°.

(iii) Impurity Concentration

On the gallium polar surface side of the conductive C-plane GaN substrate made in (1) above, concentrations of F, I O, and H within a range of from the surface to a depth of 10 μm were measured by SIMS. The concentrations in a part with a depth of 1 μm or more were as follows: $1 \times 10^{16}$ atoms/cm$^3$ for F; $2 \times 10^{15}$ atoms/cm$^3$ for I; $1 \times 10^{19}$ atoms/cm$^3$ for 0; and $1 \times 10^{19}$ atoms/cm$^3$ for H.

4. SUPPLEMENTARY NOTE

It is noted that the present specification also discloses the following methods for producing a C-plane GaN substrate.

[101] A method for producing a C-plane GaN substrate, comprising: a first step of preparing a GaN seed having a nitrogen polar surface; a second step of arranging a pattern mask on the nitrogen polar surface of the GaN seed, the pattern mask being provided with a plurality of linear openings parallel to each other at a pitch of less than 3 mm; a third step of ammonothermally growing a GaN crystal on the nitrogen polar surface of the GaN seed through the pattern mask such that a gap is formed between the GaN crystal and a top surface of the pattern mask; and a fourth step of processing the GaN crystal to obtain a C-plane GaN substrate.

[102] The production method described in [101] above, wherein the pitch between the plurality of linear openings provided in the pattern mask is 1 mm or more.

[103] The production method described in [101] or [102] above, wherein in the second step, the pattern mask is arranged such that the longitudinal direction of the plurality of linear openings form an angle of 12°±5° with a direction of an intersection line between the nitrogen polar surface and an M-plane.

[104] A method for producing a C-plane GaN substrate, comprising: a first step of preparing a GaN seed having a nitrogen polar surface; a second step of arranging a pattern mask on the nitrogen polar surface of the GaN seed, the pattern mask being provided with a periodical opening pattern comprising linear openings and including intersections; a third step of ammonothermally growing a GaN crystal on the nitrogen polar surface of the GaN seed through the pattern mask such that a gap is formed between the GaN crystal and the pattern mask; and a fourth step of processing the GaN crystal to obtain a C-plane GaN substrate.

[105] The production method described in [104] above, wherein the intersections are continuous intersections.

[106] The production method described in [104] or [105] above, wherein the arrangement of the intersections in the periodical opening pattern is two-dimensional.

[107] The production method described in [106] above, wherein the pattern mask includes the intersections at a number density of 1 cm$^{-2}$ or more.

[108] The production method described in [106] or [107] above, wherein every non-opening part included in a unit pattern of the pattern mask is quadrangular or hexagonal, and none of the linear openings included in the pattern mask is arranged at a pitch of less than 1 mm.

[109] The production method described in [108] above, wherein the pattern mask includes the linear openings arranged at a pitch of 10 mm or less.

[110] The production method described in [108] above, wherein the pattern mask includes the linear openings arranged at a pitch of less than 2 mm and the linear openings arranged at a pitch of 2 mm or more, includes the linear openings arranged at a pitch of less than 3 mm and the linear openings arranged at a pitch of 3 mm or more, or includes the linear openings arranged at a pitch of less than 4 mm and the linear openings arranged at a pitch of 4 mm or more.

[111] The production method described in [110] above, wherein the pattern mask includes the linear openings arranged at a pitch of 4 mm or more.

[111] The production method described in any one of [104] to above, wherein the periodical opening pattern is a quadrangular grid pattern, and in the second step, the pattern mask is provided with a first linear openings and a second linear openings where the longitudinal direction of the first linear openings and the longitudinal direction of the second linear openings differ from each other.

[113] The production method described in [112] above, wherein one of a pitch between the first linear openings and a pitch between the second linear openings is not less than 1.5 times the other.

[114] The production method described in any one of [104] to [113] above, wherein in the second step, the pattern mask is arranged such that longitudinal directions of at least part of the linear openings form an angle of 12°±5° with a direction of an intersection line between the nitrogen polar surface and an M-plane.

[115] The production method described in any one of [104] to above, wherein in the second step, the pattern mask is arranged such that longitudinal directions of portions of the linear openings which account for 50% or more of the total length thereof form an angle of 12°±5° with a direction of an intersection line between the nitrogen polar surface and an M-plane.

[116] The production method described in any one of [104] to [115] above, wherein in the second step, the pattern mask is arranged such that longitudinal directions of all portions of the linear openings form an angle of 12°±5° with a direction of an intersection line between the nitrogen polar surface and an M-plane.

[117] The production method described in any one of [101] to [116] above, wherein in the third step, a void is formed between the GaN crystal and the pattern mask.

[118] The production method described in [117] above, wherein in the third step, the GaN crystal is grown such that no through-hole remains above the non-opening parts of the pattern mask.

[119] The production method described in any one of [101] to [118] above, wherein mineralizers used in the third step include $NH_4F$ and one or more ammonium halides selected from $NH_4Cl$, $NH_4Br$, and $NH_4I$.

[120] The production method described in [119] above, wherein the mineralizers used in the third step include $NH_4I$ and $NH_4F$.

[121] The production method described in [120] above, wherein the GaN crystal contains F and I.

[122] The production method described in any one of [101] to [121], wherein the GaN seed has a size of 45 mm or more in all of a [1-100] direction, a [10-10] direction, and a [01-10] direction.

[123] The production method described in any one of [101] to [122] above, wherein the GaN crystal has a size of 45 mm or more in all of a [1-100] direction, a [10-10] direction, and a [01-10] direction.

[124] The production method described in any one of [101] to [123] above, wherein the C-plane GaN substrate has a size of 45 mm or more in all of a [1-100] direction, a [10-10] direction, and a [01-10] direction.

[125] The production method described in any one of [101] to [124] above, wherein the fourth step comprises a sub-step of slicing the GaN crystal parallel to or substantially parallel to a C-plane.

By using the production methods described in [101] to above, a C-plane GaN substrate for various applications including a substrate for producing nitride semiconductor devices and a seed for growing bulk GaN crystals may be produced.

It is noted that the following matters are also included in the invention disclosed in the present specification.

[126] A C-plane GaN substrate, wherein at least one first line segment which is a virtual line segment with a length of 40 mm can be drawn at least on one main surface of the substrate, the first line segment satisfying at least one of the following conditions (A1) and (B1):

(A1) when an XRC of (004) reflection is measured at 1 mm intervals on the first line segment with a plane of incidence of X-rays parallel to the first line segment in each co scan, a maximum value of XRC-FWHMs across all measurement points is less than 30 arcsec, preferably less than 25 arcsec, and more preferably less than 20 arcsec; and (B1) when an XRC of the (004) reflection is measured at 1 mm intervals on the first line segment with a plane of incidence of X-rays parallel to the first line segment in each co scan, a difference between maximum and minimum values of XRC peak angles across all the measurement points is less than 0.2°, preferably less than 0.15°, and more preferably less than 0.1°.

[127] The C-plane GaN substrate described in [126] above, wherein the substrate has an O concentration of $1\times10^{18}$ atoms/cm$^{-3}$ or more and preferably $2\times10^{18}$ atoms/cm$^{-3}$. A ratio between maximum and minimum values of the O concentration at least on one main surface of the C-plane GaN substrate is preferably less than 10.

[128] The C-plane GaN substrate described in [126] or [127] above, wherein the substrate has an O concentration of less than $1\times10^{19}$ atoms/cm$^{-3}$ and preferably less than $8\times10^{18}$ atoms/cm$^{-3}$. A ratio between maximum and minimum values of the O concentration at least on one main surface of the C-plane GaN substrate is preferably less than 10.

[129] The C-plane GaN substrate described in any one of [126] to [128] above, wherein the substrate is an n-type semiconductor.

[130] The C-plane GaN substrate described in [129] above, wherein a Hall mobility of an n-type carrier is more than 120 cm$^2$/V·s, preferably more than 150 cm$^2$/V·s, more preferably more than 160 cm$^2$/V·s, and more preferably more than 170 cm$^2$/V·s.

[131] The C-plane GaN substrate described in any one of [126] to [130] above, wherein concentrations of Li, Na, K, Mg, and Ca are all less than $1\times10^{16}$ atoms/cm$^3$.

[132] The C-plane GaN substrate described in any one of [126] to [131] above, wherein the substrate contains F.

[133] The C-plane GaN substrate described in [132] above, wherein the substrate contains, in addition to F, one or more halogens selected from Cl, Br, and I.

[134] The C-plane GaN substrate described in [133] above, wherein the substrate contains F and I.

[135] The C-plane GaN substrate described in any one of [126] to [134] above, wherein the substrate has an H concentration of not less than $5\times10^{17}$ atoms/cm$^3$ and not more than $1\times10^{20}$ atoms/cm$^3$ and preferably not more than $5\times10^{19}$ atoms/cm$^3$.

[136] The C-plane GaN substrate described in any one of [126] to [135] above, wherein the substrate comprises a GaN crystal having an infrared absorption peak attributable to a gallium vacancy-hydrogen complex within a range of 3140 to 3200 cm$^{-1}$.

[137] The C-plane GaN substrate described in any one of [126] to [136] above, wherein the first line segment satisfies the condition (A1).

[138] The C-plane GaN substrate described in [137] above, wherein the first line segment satisfies, in addition to the condition (A1), the following condition (A2):
(A2) an average value of the XRC-FWHMs across all the measurement points on the first line segment obtained by the XRC measurement as specified in the condition (A1) is less than 20 arcsec, preferably 16 arcsec, and more preferably less than 12 arcsec.

[139] The C-plane GaN substrate described in [137] above, wherein the first line segment satisfies, in addition to the condition (A1), the following condition (A3):
(A3) an average value and a standard deviation of the XRC-FWHMs across all the measurement points on the first line segment obtained by the XRC measurement as specified in the condition (A1) are less than 12 arcsec and less than 5 arcsec, respectively.

[140] The C-plane GaN substrate described in any one of [126] to [139] above, wherein at least one second line segment which is a virtual line segment with a length of 40 mm can be drawn on the main surface on which the first line segment can be drawn, the second line segment satisfying at least one of the following conditions (C1) and (D1):
(C1) the second line segment is orthogonal to at least one of the first line segment, and when an XRC of the (004) reflection is measured at 1 mm intervals on the second line segment with a plane of incidence of X-rays parallel to the second line segment in each ω scan, a maximum value of XRC-FWHMs across all measurement points is less than 30 arcsec, preferably less than 25 arcsec, and more preferably less than 20 arcsec; and
(D1) the second line segment is orthogonal to at least one of the first line segment, and when an XRC of the (004) reflection is measured at 1 mm intervals on the second line segment with a plane of incidence of X-rays parallel to the second line segment in each ω scan, a difference between maximum and minimum values of XRC peak angles across all the measurement points is less than 0.2°, preferably less than 0.15°, and more preferably less than 0.1°.

[141] The C-plane GaN substrate described in [140] above, wherein the second line segment satisfies the condition (C1).

[142] The C-plane GaN substrate described in [141] above, wherein the second line segment satisfies, in addition to the condition (C1), the following condition (C2):
(C2) an average value of the XRC-FWHMs across all the measurement points on the second line segment obtained by the XRC measurement as specified in the condition (C1) is less than 20 arcsec, preferably 16 arcsec, and more preferably less than 12 arcsec.

[143] The C-plane GaN substrate described in [141] above, wherein the second line segment satisfies, in addition to the condition (C1), the following condition (C3):
(C3) an average value and a standard deviation of the XRC-FWHMs across all the measurement points on the second line segment obtained by the XRC measurement as specified in the condition (C1) are less than 12 arcsec and less than 5 arcsec, respectively.

[144] The C-plane GaN substrate described in any one of [126] to [143] above, wherein the substrate has a plurality of dislocation arrays periodically arranged on the main surface on which the first line segment can be drawn.

[145] The C-plane GaN substrate described in [144] above, wherein the arrangement of the plurality of dislocation arrays on the main surface is two-dimensional.

[146] The C-plane GaN substrate described in [145] above, wherein the arrangement of the plurality of dislocation arrays on the main surface has periodicity in two or more directions.

[147] The C-plane GaN substrate described in any one of [126] to [146] above, wherein the substrate has a size of 45 mm or more in all of a [1-100] direction, a [10-10] direction, and a [01-10] direction.

[148] The C-plane GaN substrate described in any one of [126] to [147] above, wherein the substrate is disk-shaped and has a diameter of 45 mm or more.

[149] The C-plane GaN substrate described in any one of [126] to [148] above, wherein the substrate has a gallium polar surface having an orientation of within 5° from [0001].

[150] A method for producing a nitride semiconductor device, comprising the steps of: preparing the C-plane GaN substrate described in any one of [126] to [149] above; and epitaxially growing at least one nitride semiconductor on the prepared C-plane GaN substrate.

[151] A method for producing an epitaxial substrate, comprising the steps of: preparing the C-plane GaN substrate described in any one of [126] to [149] above; and epitaxially growing at least one nitride semiconductor on the prepared C-plane GaN substrate.

[152] A method for producing a bulk nitride semiconductor crystal, comprising the steps of: preparing the C-plane GaN substrate described in any one of [126] to [149] above; and epitaxially growing one or more nitride semiconductor crystals on the prepared C-plane GaN substrate.

[153] A method for producing a GaN layer-bonded substrate, comprising the steps of: preparing the C-plane GaN substrate described in any one of [126] to [149] above; and bonding the prepared C-plane GaN substrate to a heterogeneous substrate.

Although the present invention has been described with reference to specific embodiments as above, each embodiment was presented as an example and does not limit the scope of the present invention. Each of the embodiments described herein can be variously modified within the scope not departing from the spirit of the present invention, and can be combined with any feature described in other embodiments as long as such a combination is enable.

REFERENCE SIGNS LIST 10 conductive C-plane GaN substrate
11 gallium polar surface
12 nitrogen polar surface
13 side surface
20 GaN seed
21 gallium polar surface
22 nitrogen polar surface
23 side surface
30 pattern mask
31 linear opening
311 first linear opening
312 second linear opening
40 GaN crystal
G gap
T through-hole
V void
K intersection
LS1 first line segment
LS2 second line segment
100 crystal growth apparatus
101 autoclave
102 capsule 102a feedstock dissolution zone
102b crystal growth zone
103 baffle
104 Pt wire
105 vacuum pump
106 ammonia cylinder
107 nitrogen cylinder
108 valve
109 mass flow meter
S seed
FS feedstock

What is claimed is:

1. A conductive C-plane GaN substrate having a resistivity of $2\times10^{-2}$ Ω·cm or less or an n-type carrier concentration of $1\times10^{18}$ cm$^{-3}$ or more at room temperature, wherein
at least one first line segment which is a virtual line segment with a length of 40 mm can be drawn at least on one main surface of the substrate, the first line segment satisfying the following condition (B1):
(B1) when an XRC of the (004) reflection is measured at 1 mm intervals on the first line segment with a plane of incidence of X-rays parallel to the first line segment in each w scan, a difference between maximum and minimum values of XRC peak angles across all the measurement points is less than 0.2°.

2. The conductive C-plane GaN substrate according to claim 1, wherein at least one second line segment which is a virtual line segment with a length of 40 mm can be drawn on the main surface on which the at least one first line segment can be drawn, each second line segment satisfying the following condition (D1):
(D1) the second line segment is orthogonal to at least one first line segment, and when an XRC of the (004) reflection is measured at 1 mm intervals on the second line segment with a plane of incidence of X-rays parallel to the second line segment in each w scan, a difference between maximum and minimum values of XRC peak angles across all the measurement points is less than 0.2°.

3. The conductive C-plane GaN substrate according to claim 1, wherein the substrate has a plurality of dislocation arrays periodically arranged on the main surface on which the first line segment can be drawn.

4. The conductive C-plane GaN substrate according to claim 3, wherein the arrangement of the plurality of dislocation arrays on the main surface is two-dimensional.

5. The conductive C-plane GaN substrate according to claim 4, wherein the arrangement of the plurality of dislocation arrays on the main surface has periodicity in two or more directions.

6. The conductive C-plane GaN substrate according to claim 1, wherein the substrate has a resistivity of $2\times10^{-2}$ Ω·cm or less at room temperature.

7. The conductive C-plane GaN substrate according to claim 1, wherein the substrate has an n-type carrier concentration of $1\times10^{18}$ cm$^{-3}$ or more at room temperature.

8. The conductive C-plane GaN substrate according to claim 1, wherein the substrate has an O concentration higher than an n-type carrier concentration of the substrate at room temperature.

9. The conductive C-plane GaN substrate according to claim 8, wherein the n-type carrier concentration at room temperature is from 20 to 70% of the O concentration.

10. The conductive C-plane GaN substrate according to claim 1, wherein concentrations of Li, Na, K, Mg, and Ca are all less than $1\times10^{16}$ atoms/cm$^3$.

11. The conductive C-plane GaN substrate according to claim 10, wherein the substrate contains F.

12. The conductive C-plane GaN substrate according to claim 11, wherein the substrate contains, in addition to F, one or more halogens selected from Cl, Br, and I.

13. The conductive C-plane GaN substrate according to claim 12, wherein the substrate contains F and I.

14. The conductive C-plane GaN substrate according to claim 1, wherein the substrate has an H concentration of not less than $5\times10^{17}$ atoms/cm$^3$ and not more than $1\times10^{20}$ atoms/cm$^3$.

15. The conductive C-plane GaN substrate according to claim 1, wherein the substrate comprises a GaN crystal having an infrared absorption peak attributable to a gallium vacancy-hydrogen complex within a range of 3140 to 3200 cm$^{-1}$.

16. The conductive C-plane GaN substrate according to claim 1, wherein the substrate has a size of 45 mm or more in all of a [1-100] direction, a [10-10] direction, and a [01-10] direction.

17. The conductive C-plane GaN substrate according to claim 1, wherein the substrate is disk-shaped and has a diameter of 45 mm or more.

18. The conductive C-plane GaN substrate according to claim 1, wherein the substrate has a gallium polar surface having an orientation of within 5° from [0001].

* * * * *